US012592293B2

(12) United States Patent
Chang et al.

(10) Patent No.: US 12,592,293 B2
(45) Date of Patent: Mar. 31, 2026

(54) SEMICONDUCTOR DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Meng-Sheng Chang, Hsinchu (TW); Yao-Jen Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 27 days.

(21) Appl. No.: 18/503,386

(22) Filed: Nov. 7, 2023

(65) Prior Publication Data

US 2025/0006282 A1 Jan. 2, 2025

Related U.S. Application Data

(60) Provisional application No. 63/510,803, filed on Jun. 28, 2023.

(51) Int. Cl.
*G11C 17/16* (2006.01)
*G11C 17/18* (2006.01)
(52) U.S. Cl.
CPC .............. *G11C 17/16* (2013.01); *G11C 17/18* (2013.01)
(58) Field of Classification Search
CPC ................................ G11C 17/16; G11C 17/18
USPC ................................................ 365/189.09, 96
See application file for complete search history.

(56) References Cited

U.S. PATENT DOCUMENTS

| | | | | |
|---|---|---|---|---|
| 6,781,857 B1* | 8/2004 | Lien | ....................... | G11C 15/04 |
| | | | | 365/233.1 |
| 8,179,711 B2* | 5/2012 | Kim | ................... | G11C 11/5678 |
| | | | | 365/163 |
| 9,704,566 B2 | 7/2017 | Ishii | | |
| 11,170,844 B1* | 11/2021 | Doluca | ................. | H10B 10/12 |
| 2004/0047204 A1* | 3/2004 | Hung | ....................... | G11C 11/16 |
| | | | | 365/202 |
| 2005/0024976 A1* | 2/2005 | Kang | ................... | G11C 29/848 |
| | | | | 365/232 |
| 2008/0117660 A1* | 5/2008 | Xu | ......................... | G11C 17/16 |
| | | | | 365/96 |
| 2011/0032751 A1* | 2/2011 | Funane | .................... | G11C 8/16 |
| | | | | 365/156 |
| 2012/0039113 A1* | 2/2012 | Wang | ................... | H10N 70/245 |
| | | | | 257/2 |

(Continued)

FOREIGN PATENT DOCUMENTS

TW 202309902 3/2023

*Primary Examiner* — Michael T Tran
(74) *Attorney, Agent, or Firm* — Hauptman Ham, LLP

(57) ABSTRACT

A semiconductor device and a method for manufacturing the semiconductor device are provided. The semiconductor device includes a first transistor, the second transistor, a first circuit, a second circuit and a third transistor. The second transistor is electrically connected to the first transistor, wherein gates of the first transistor and the second transistor are electrically connected to a word line. The first circuit is electrically connected between a drain of the first transistor and a first bit line. The second circuit is electrically connected between a drain of the second transistor and a second bit line. The third transistor is electrically connected between the drain of the first transistor and the drain of the second transistor.

20 Claims, 14 Drawing Sheets

<u>100A</u>

(56)         References Cited

U.S. PATENT DOCUMENTS

| | | | |
|---|---|---|---|
| 2012/0314492 A1* | 12/2012 | Shin ................... | G11C 13/0059 |
| | | | 365/163 |
| 2013/0182518 A1* | 7/2013 | Kim ..................... | G11C 17/18 |
| | | | 365/201 |
| 2017/0178745 A1* | 6/2017 | Chen ..................... | G11C 17/18 |
| 2018/0211706 A1* | 7/2018 | Haibi ..................... | G11C 8/08 |
| 2019/0287610 A1* | 9/2019 | Oda ..................... | G11C 11/419 |
| 2020/0035281 A1* | 1/2020 | Kim ..................... | G11C 7/1006 |
| 2021/0407559 A1* | 12/2021 | Kota ..................... | G11C 7/062 |
| 2022/0189515 A1* | 6/2022 | Lee ..................... | H10B 12/09 |

* cited by examiner

200A

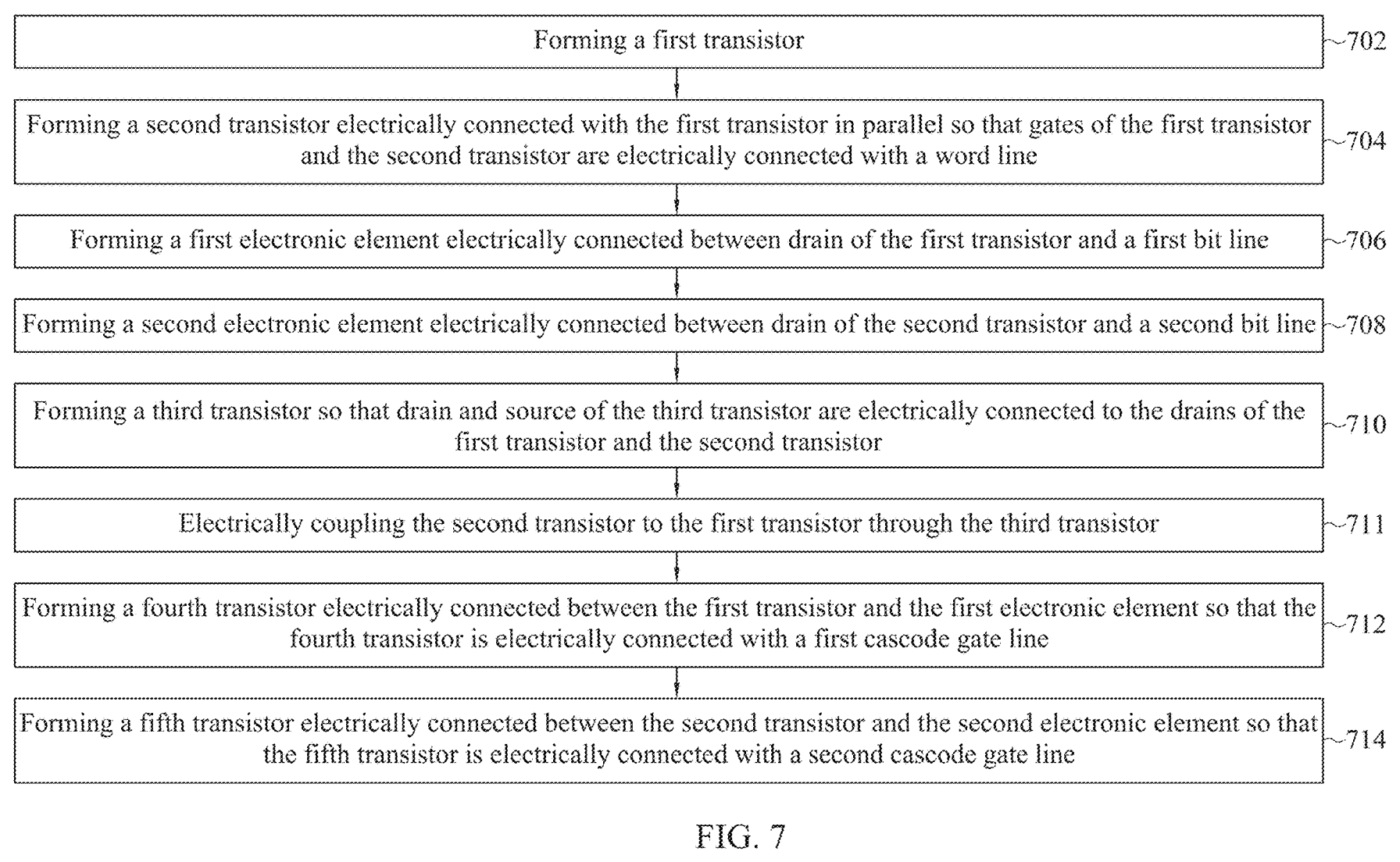

Forming a first transistor ~702

Forming a second transistor electrically connected with the first transistor in parallel so that gates of the first transistor and the second transistor are electrically connected with a word line ~704

Forming a first electronic element electrically connected between drain of the first transistor and a first bit line ~706

Forming a second electronic element electrically connected between drain of the second transistor and a second bit line ~708

Forming a third transistor so that drain and source of the third transistor are electrically connected to the drains of the first transistor and the second transistor ~710

Electrically coupling the second transistor to the first transistor through the third transistor ~711

Forming a fourth transistor electrically connected between the first transistor and the first electronic element so that the fourth transistor is electrically connected with a first cascode gate line ~712

Forming a fifth transistor electrically connected between the second transistor and the second electronic element so that the fifth transistor is electrically connected with a second cascode gate line ~714

FIG. 7

SEMICONDUCTOR DEVICE AND METHOD FOR MANUFACTURING THE SAME

CROSS-REFERENCE TO RELATED APPLICATIONS

This application claims the benefit of U.S. Provisional Application No. 63/510,803, filed Jun. 28, 2023, the entire disclosure of which is incorporated by reference herein.

BACKGROUND

Memory devices with metal fuse are used for various applications, such as one time programming, to store data even when power is off from the memory devices. However, the dimensions of memory devices is very large because they include large transistors that are capable of handling large currents for the metal fuse. However, when operated, the memory devices may have large leakage current which deteriorates accuracy of accessing memory data.

BRIEF DESCRIPTION OF THE DRAWINGS

Aspects of the embodiments of the present disclosure are best understood from the following detailed description when read with the accompanying figures. It should be noted that, in accordance with standard practice in the industry, various structures are not drawn to scale. In fact, the dimensions of the various structures can be arbitrarily increased or reduced for clarity of discussion.

FIG. 7 illustrates a flow chart including operations for manufacturing a semiconductor device, in accordance with some embodiments of the present disclosure.

DETAILED DESCRIPTION

Figure 1A:
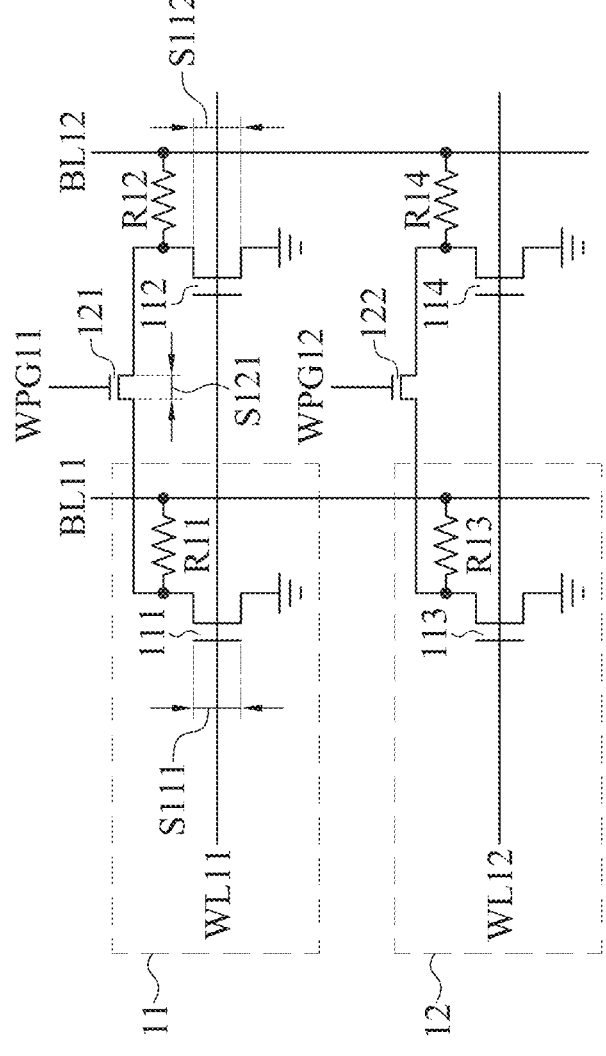
FIG. 1A is a schematic view of a semiconductor device with power-gate transistors, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1A is a circuit view of a semiconductor device 100A, in accordance with some embodiments of the present disclosure.

In some embodiments, semiconductor device 100A is a memory circuit.

In some embodiments, the memory circuit is a multi-time programming memory (also referred to as MTP memory), a one-time programmable (OTP) memory, a fuse element, or the like. In some embodiments, some types of OTP memory, such as an electrical fuse (eFuse) use a narrow stripe (also called a "link") of conductive material (metal, polysilicon, or the like) connected to other circuit elements at each end. Other memory types are within the scope of the present disclosure. In some embodiments, the memory circuit is a magnetic RAM (MRAM) circuit or a phase change RAM (PCRAM) circuit.

The semiconductor device 100A includes several cells, such as a cell 11 and a cell 12. In some embodiments, the semiconductor device 100A is referred to as a "1.5T1R" embodiment, where "T" represents a transistor and "R" represents a resistor. The cell 11 includes a transistor 111, an electronic element R11 and ½ of transistor 121 (e.g., transistor 121 is shared by transistors 111 and 112), and is therefore, cell 11 is referred to as "1.5T1R" cell. The semiconductor device 100A further includes a transistor 111, a transistor 112, a transistor 113, a transistor 114, a transistor 121 and a transistor 122. The semiconductor device 100A further includes an electronic element R11, an electronic element R12, an electronic element R13 and an electronic element R14. In some embodiments, the electronic element includes or corresponds to a circuit. The cell 11 includes the transistor 111 and the electronic element R11. The cell 12 includes the transistor 113 and the electronic element R13. In some embodiments, each cell 11 or 12 is a corresponding memory cell.

In some embodiments, each of the transistors 121 and 122 is a power-gate (PG) transistor. Each of the transistors 111, 112, 113, 114, 121 and 122 is an N-type metal-oxide-semiconductor (NMOS) transistor. Other transistor types are within the scope of the present disclosure. Each of the electronic elements R11 to R14 includes a resistor. In some embodiments, each of the electronic elements R11 to R14 includes a metal fuse or an efuse (electronic fuse). The metal fuse or efuse is burned so that data is programmed for the semiconductor device 100A. In some embodiments, the semiconductor device 100A includes a one-time program-ming (OTP) device. The semiconductor device 100A is an OTP device. In some embodiments, each of the transistors 111, 112, 113, 114, 121 and 122 further represent or include a set of M transistors. The transistors 111 and 112 are in parallel when the transistor 121 is on. The transistors 113 and 114 are in parallel when the transistor 121 is on. M is a positive integer greater than zero. The drains of the M transistors are directly connected, and the sources of the M transistors are directly connected.

The transistor 111 is electrically connected to the transistor 112 through the transistor 121. The transistor 121 is electrically connected between the drains of the transistors 111 and 112. A drain/source of transistor 121 is electrically connected to the drain of transistor 111. A source/drain of transistor 121 is electrically connected to the drain of transistor 112. Source/drain region(s) may refer to a source or a drain, individually or collectively dependent upon the context.

The transistor 113 is electrically connected to the transistor 114 through the transistor 122. The transistor 122 is electrically connected between the drains of the transistors 113 and 114. A drain/source of transistor 122 is electrically connected to the drain of transistor 113. A source/drain of transistor 122 is electrically connected to the drain of transistor 114.

The gates of the transistors 111 and 112 are electrically connected to word line WL11. The gates of the transistors 113 and 114 are electrically connected to word line WL12. The gate of the transistor 121 is electrically connected to power-gate word line WPG11. The gate of the transistor 122 is electrically connected to power-gate word line WPG12. A source of each transistor 111, 112, 113 and 114 is electrically to reference voltage supply VSS.

The transistor 111 is electrically connected to bit line BL11 through the electronic element R11. The electronic element R11 is electrically connected between bit line BL11 and the drain of the transistor 111.

The transistor 112 is electrically connected to bit line BL12 through the electronic element R12. The electronic element R12 is electrically connected between bit line BL12 and the drain of the transistor 112.

In some embodiments, during a programming operation of semiconductor device 100A, a programming voltage is applied for selecting or enabling the cell to be programed. In some embodiments, during a programming operation, the cell 11 is selected for programming data, and is referred to as a "selected cell." In some embodiments, when cell 11 is selected, then cell 12 is BL half selected since cells 11 and 12 share the same bit line BL11. In some embodiments, during a programming operation of cell 11 (as shown in Table 1), the programming voltage, such as 1.6V to 2V, is applied or supplied to each of word line WL11, bit line BL11 and power-gate word line WPG11, thereby causing transistor 111 to turn on to set or burn the electronic element R11 correspondingly. In some embodiments, referring to Table 1, when the cell 11 is selected, the programming voltage such as 1.6V to 2V is provided to the gate of transistor 111 through word line WL11, the drain of transistor 111 by bit line BL11 and electronic element R11, and the gate of transistor 121 by power-gate word line WPG11. In some embodiments, when the cell 12 is BL half selected, the programming voltage is supplied to the drain of the transis-tor 113 by bit line BL11 and electronic element R13, and the programming voltage supplied to the gate of transistor 113 by word line WL12 is 0 volts, and the programming voltage supplied to the gate of transistor 122 is 0 volts.

TABLE 1

| | Program Operation | | Read Operation | | |
| | | BL Half- | | BL Half- | Standby |
| | Selected | Selected | Selected | Selected | Unselected |
| Word Line (WL) | 1.6 V~2 V | 0 | 0.6 V~0.9 V | 0 | 0 |

5                                    6

TABLE 1-continued

| | Program Operation | | Read Operation | | |
|---|---|---|---|---|---|
| | Selected | BL Half-Selected | Selected | BL Half-Selected | Standby Unselected |
| Bit Line (BL) | 1.6 V~2 V | 1.6 V~2 V | 0.6 V~0.9 V | 0.6 V~0.9 V | 0 |
| Power-Gate Word Line (WPG) | 1.6 V~2 V | 0 | 0 | 0 | 0 |

Table 1

In addition, transistors 111, 112 and 121 are turned on during the program operation since the programming voltages shown in Table 1 are applied to word line WL11, bit line BL11 and power-gate word line WPG11. The transistor 121 is shared by the transistors 111 and 112 during the program operation. During the program operation, the transistor 112 is electrically connected to the transistor 111 through the transistor 121, and thus transistors 111 and 112 are configured in parallel as a current divider. As previously mentioned, transistors 111 and 112 each represent or include a set of M transistors connected in parallel when transistor 121 is turned on. By arranging the transistor 121 in the semiconductor device 100A, the number of transistors included is reduced by approximately 50% because the transistors 111 and 112 are configured in parallel. That is, the set of M transistors included in the transistors 111 and 112 is decreased to 0.5M transistors, without affecting or sacrificing the program operation of the semiconductor device 100A. Therefore, the area of the semiconductor device 100A is reduced by approximately 50%. The area ratio and the program performance of the semiconductor device 100A is enhanced.

In some embodiments, during a read operation of semiconductor device 100A, a read voltage, such as 0.6V to 0.9V, is applied for selecting or enabling the cell to be read. In some embodiments, during a read operation, the cell 11 is selected for reading data, and is referred to as a "selected cell." In some embodiments, when cell 11 is selected, then cell 12 is BL half selected since cells 11 and 12 share the same bit line BL11. In some embodiments, during a read operation of cell 11 (as shown in Table 1), the read voltage is applied or supplied to each of word line WL11 and bit line BL11 to turn on the transistor 111. In some embodiments, when the cell 11 is selected, the read voltage is supplied to the gate of transistor 111 by word line WL11, the drain of the transistor 111 by bit line BL11 and electronic element R11, and the read voltage supplied to the gate of transistor 113 by word line WL12 is 0 volts, thereby causing transistor 121 to be turned off during the read operation. In some embodiments, when the cell 12 is BL half selected, the read voltage is supplied to the drain of the transistor 113 by bit line BL11 and electronic element R11, and the read voltage supplied to the gate of transistor 113 by word line WL12 is 0 volts thereby causing transistor 122 to be turned off during the read operation. In some embodiments, the number of the set of transistors is decreased from M to 0.5M, and thus the leakage current of the semiconductor device 100A is reduced by approximately 50% to improve the accuracy on reading data. The read margin of the semiconductor device 100A is increased corresponding to the decreasing of the leakage current.

In some embodiments, the programming voltage is different from the read voltage. In some embodiments, the programming voltage is substantially identical to the read voltage. In some embodiments, the programming voltage is greater than the reading voltage. In some embodiments, the programming voltage is greater than twice that of the read voltage.

In some embodiments, the size S121 of the transistor 121 is identical to the size S111 of the transistor 111 and the size S112 of the transistor 112. In some embodiments, the size S121 of the transistor 121 is different from the size S111 of the transistor 111 and the size S112 of the transistor 112. In some embodiments, the size of the transistor represents or indicates the length of the transistor, which is defined as a distance of the channel between source and drain of the transistor. In some embodiments, the size of the transistor represents or indicates the width of the transistor, which is perpendicular to the length. In some embodiments, the size of the transistor represents or indicates the area of the transistor, which is proportional to the length and the width of the transistor.

In some embodiments, the size S121 of the transistor 121 is smaller than the size S111 of the transistor 111 and the size S112 of the transistor 112 to reduce the total area and the leakage current of the semiconductor device 100A. In some embodiments, the size of the transistor represents or indicates the length of the transistor, which is defined as a distance of the channel between source and drain of the transistor. In some embodiments, the size of the transistor represents or indicates the width of the transistor, which is perpendicular to the length. In some embodiments, the size of the transistor represents or indicates the area of the transistor, which is proportional to the length and the width of the transistor. In some embodiments, the size S121 of the transistor 121 is substantially half of the size S111 of the transistor 111 and the size S112 of the transistor 112. In some embodiments, the size S121 of the transistor 121 is smaller than half of the size S111 of the transistor 111 and the size S112 of the transistor 112. In some embodiments, the size S121 of the transistor 121 is in a range of 10% to 50% of the size S111 of the transistor 111 and the size S112 of the transistor 112. As a result, the total area of the semiconductor device 100A is reduced to achieve a better area ratio. The leakage current is decreased because the total area of the semiconductor device 100A is reduced. If the size S121 of the transistor 121 is excessively large, unwanted large leakage current might occur. If the size S121 of the transistor 121 is excessively small, the leakage current will be decreased, which allows arranging more cells, improving the performance and enhancing the reliability for the semiconductor device 100A.

Figure 1B:
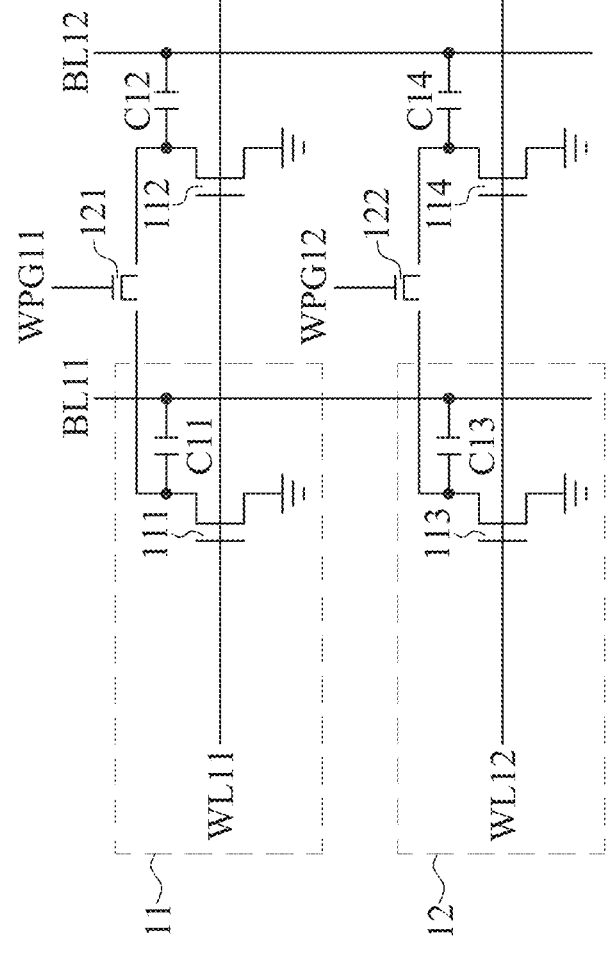
FIG. 1B is a schematic view of another semiconductor device with power-gate transistors, in accordance with some embodiments of the present disclosure.

FIG. 1B is a schematic view of another semiconductor device 100B with power-gate transistors, in accordance with some embodiments of the present disclosure. The semiconductor device 100B of FIG. 1B is similar to or correspond to the semiconductor device 100A of FIG. 1A, except for the differences described as follows.

The semiconductor device 100B corresponds to "1.5TIC" embodiment, and "T" represents transistor and "C" represents capacitor. The semiconductor device 100B includes cells 11 and 12. The semiconductor device 100B includes transistors 111, 112, 113, 114, 121 and 122. The semiconductor device 100B includes electronic elements C11, C12, C13 and C14. The transistors 111 and 112 are electrically connected to word line WL11. The transistors 113 and 114 are electrically connected to word line WL12. The transistors 111 and 113 are electrically connected to bit line BL11.

The transistors 112 and 114 are electrically connected to bit line BL12. The transistors 121 and 123 are electrically connected to power-gate word lines WPG11 and WPG12 respectively. In some embodiments, each of the electronic elements C11, C12, C13 and C14 includes a capacitor for programming data. The operations of the semiconductor device 100B are similar to those of the semiconductor device 100A, and thus the details are omitted here. In some embodiments, the electronic elements C11 to C14 are elements for storing electric charge or energy. In some embodiments, the electronic elements R11 to R14 are elements for dissipating electric charge or energy. In some embodiments, compared to the electronic elements R11 to R14, the electronic elements C11 to C14 are usable for reducing the abnormal effect caused by abrupt voltage changes. In some embodiments, each of the electronic elements C11 to C14 includes a MIM (metal-insulator-metal) capacitor applicable for high-frequency operation or high-speed computation.

Figure 2A:
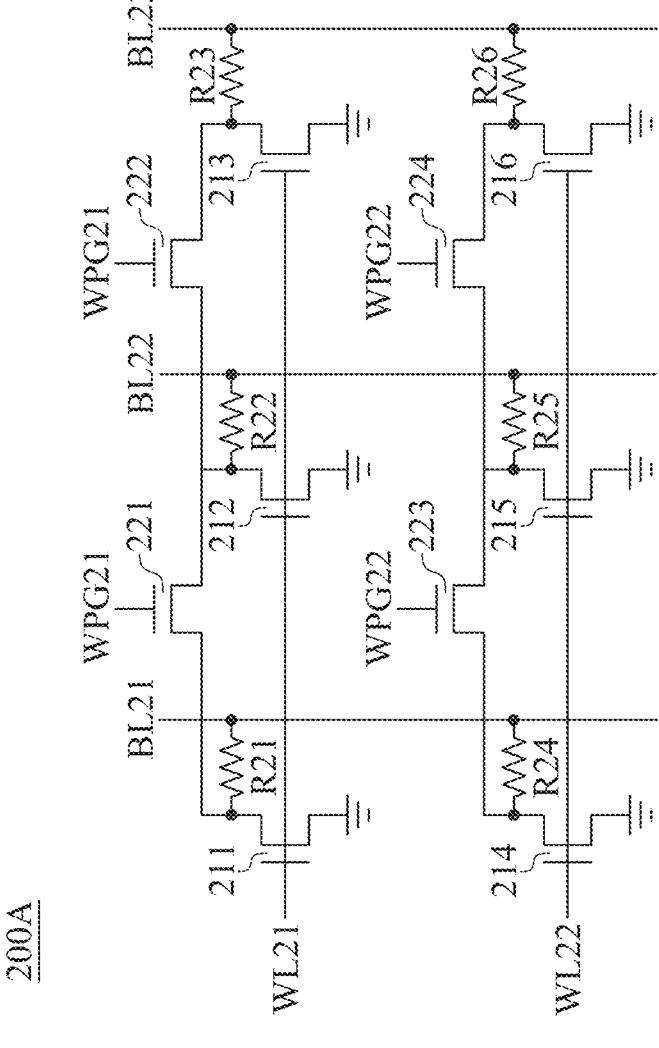
FIG. 2A is a schematic view of a semiconductor device with power-gate transistors, in accordance with some embodiments of the present disclosure.

The semiconductor device 200A corresponds to "3T" embodiment, and "T" represents transistors 211, 212 and 221. In some embodiments, the semiconductor device 200A is referred to as a "3T" embodiment, which indicates the three transistors 211, 212 and 213 controlled by the word line WL21. In some embodiments, the semiconductor device 200A includes a plurality of "1.5TIR" cells. The "1.5TIR" cell includes a transistor 211, an electronic element R21 and ½ of transistor 221 (e.g., transistor 221 is shared by transistors 211 and 212). FIG. 2A is a schematic view of a semiconductor device 200A with power-gate transistors 221 to 224, in accordance with some embodiments of the present disclosure. The semiconductor device 200A of FIG. 2A is similar to or correspond to the semiconductor device 100A of FIG. 1A, except for the differences described as follows.

The semiconductor device 200A includes transistors 211, 212, 213, 214, 215, 216, 221, 222, 223 and 224. The transistor 221 is electrically connected between the transistors 211 and 212. The transistor 222 is electrically connected between the transistors 212 and 213. The transistor 223 is electrically connected between the transistors 214 and 215. The transistor 224 is electrically connected between the transistors 215 and 216. The semiconductor device 200A includes electronic elements R21, R22, R23, R24, R25 and R26. Each of the electronic elements R21 to R26 is electrically connected to drain of each of the transistors 211 to 216 respectively.

The transistors 211, 212 and 213 are electrically connected to word line WL21. The transistors 214, 215 and 216 are electrically connected to word line WL22. The transistors 211 and 214 are electrically connected to bit line BL21. The transistors 212 and 215 are electrically connected to bit line BL22. The transistors 213 and 216 are electrically connected to bit line BL23. The transistors 221 and 222 are electrically connected to power-gate word line WPG21. The transistors 223 and 224 are electrically connected to power-gate word line WPG22.

The transistor 221 is shared by the transistors 211 and 212 during the program operation, and the transistor 222 is shared by the transistors 212 and 213 during the program operation. The transistors 211, 212 and 213 is electrically connected with each other through the transistors 221 and 222 for processing data simultaneously. By arranging the transistors 221 and 222 in the semiconductor device 200A, the set of M transistors included in the transistors 211, 212 and 213 are decreased to substantially 0.33M transistors, without affecting or sacrificing the program operation. Therefore, the area of the semiconductor device 200A is reduced to approximately 33%. The leakage current of the semiconductor device 200A is reduced to approximately 33% to improve the accuracy on reading data. As a result, the read margin of the semiconductor device 200A is increased corresponding to the decreasing of the leakage current.

Figure 2B:
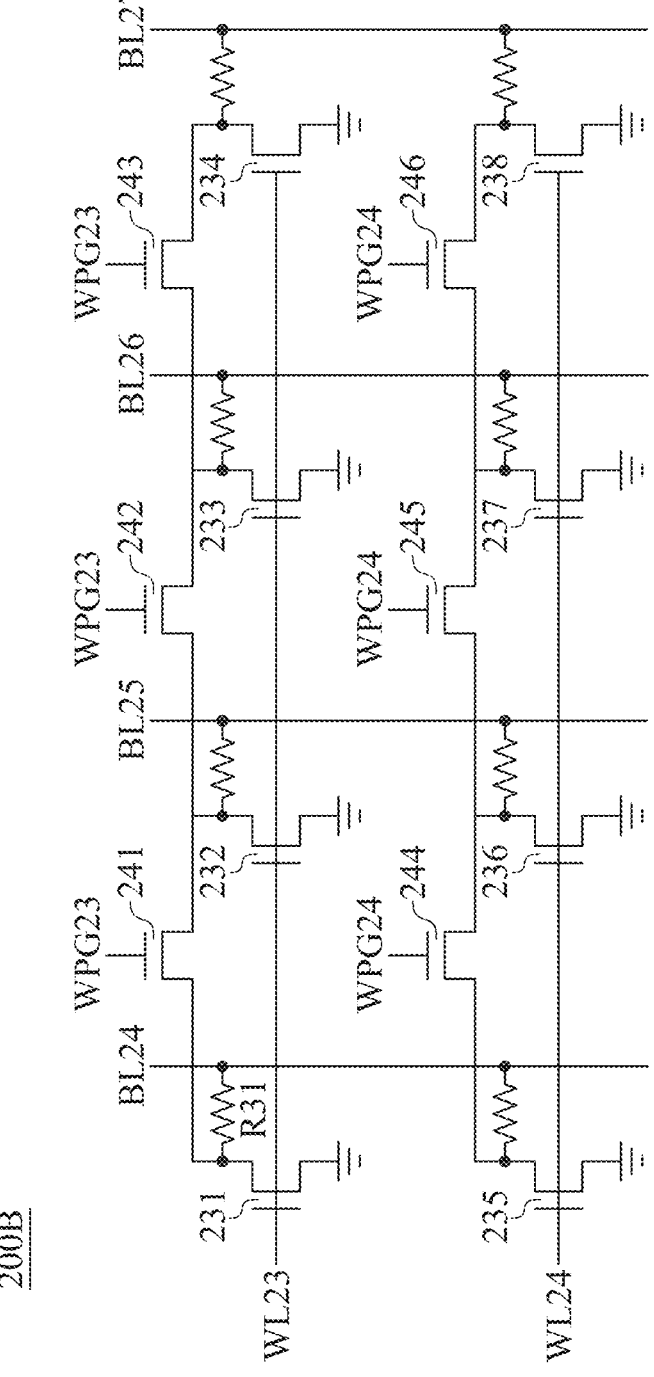
FIG. 2B is a schematic view of another semiconductor device with power-gate transistors, in accordance with some embodiments of the present disclosure.

FIG. 2B is a schematic view of another semiconductor device 200B with power-gate transistors, in accordance with some embodiments of the present disclosure. The semiconductor device 200B of FIG. 2B is similar to or correspond to the semiconductor device 200A of FIG. 2A, except for the differences described as follows.

The semiconductor device 200B corresponds to "4T" embodiment, and "T" represents transistor. The "4T" indicates the four transistors 231, 232, 233 and 234 controlled by the word line WL23. In some embodiments, the semiconductor device 200B includes a plurality of "1.5TIR" cells. The "1.5TIR" cell includes a transistor 231, an electronic element R31 and ½ of transistor 241 (e.g., transistor 241 is shared by transistors 231 and 232). The semiconductor device 200B includes transistors 231, 232, 233, 234, 235, 236, 237, 238, 241, 242, 243, 244, 245 and 246. The transistor 241 is electrically connected between the transistors 231 and 232. The transistor 242 is electrically connected between the transistors 232 and 233. The transistor 243 is electrically connected between the transistors 233 and 234. The transistor 244 is electrically connected between the transistors 235 and 236. The transistor 245 is electrically connected between the transistors 236 and 237. The transistor 246 is electrically connected between the transistors 237 and 238.

The transistors 231, 232, 233 and 234 are electrically connected to word line WL23. The transistors 235, 236, 237 and 238 are electrically connected to word line WL24. The transistors 231 and 235 are electrically connected to bit line BL24. The transistors 232 and 236 are electrically connected to bit line BL25. The transistors 233 and 237 are electrically connected to bit line BL26. The transistors 234 and 238 are electrically connected to bit line BL27. The transistors 241, 242 and 243 are electrically connected to power-gate word line WPG23. The transistors 244, 245 and 246 are electrically connected to power-gate word line WPG24.

The transistor 241 is shared by the transistors 231 and 232 during the program operation, the transistor 242 is shared by the transistors 232 and 233 during the program operation, and the transistor 243 is shared by the transistors 233 and 234 during the program operation. The transistors 231, 232, 233 and 234 are electrically connected with each other through the transistors 241, 242 and 243 for processing data simultaneously. By arranging the transistors 241, 242 and 243, the set of M transistors included in the transistors 231, 232, 233 and 234 are decreased to substantially 0.25M transistors without affecting or sacrificing the program operation. Therefore, the area of the semiconductor device 200B is reduced to approximately 25%. The leakage current of the semiconductor device 200B is reduced to approximately 25% to improve the accuracy on reading data. As a result, the read margin of the semiconductor device 200B is increased corresponding to the decreasing of the leakage current.

Figure 3:
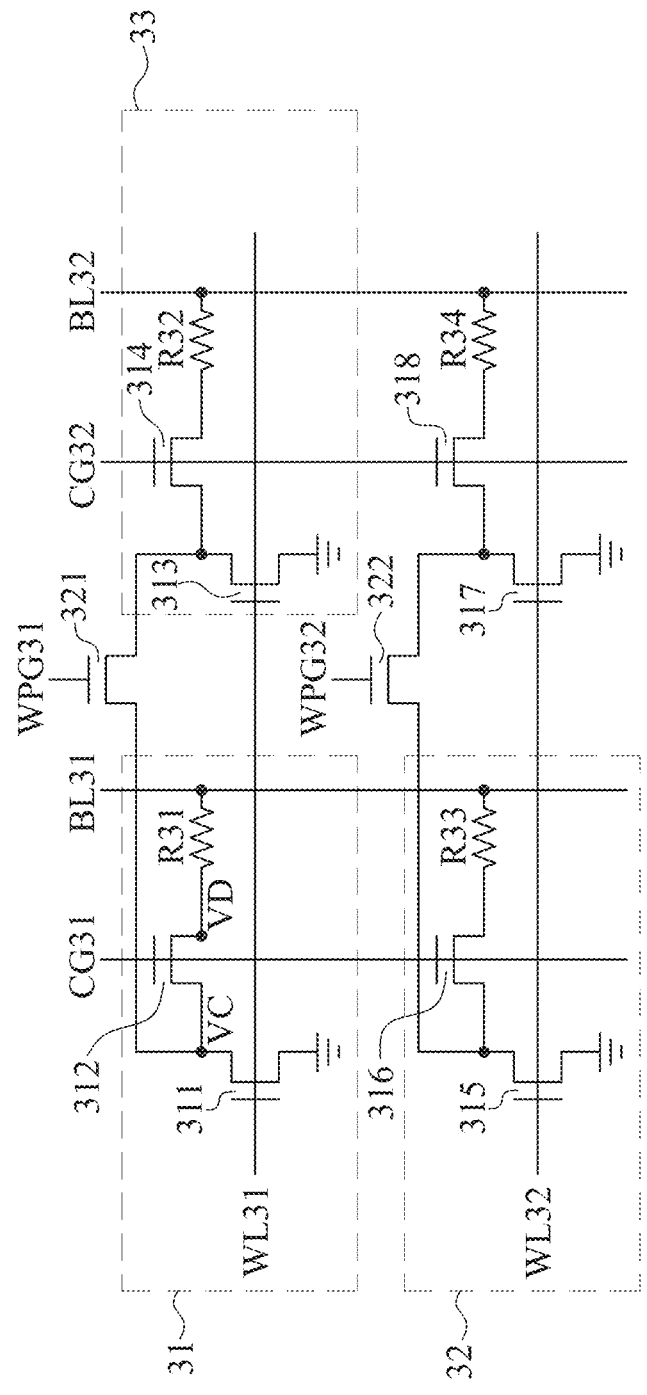
FIG. 3 is a schematic view of a semiconductor device with power-gate transistors and cascode-gate transistors, in accordance with some embodiments of the present disclosure.

FIG. 3 is a schematic view of a semiconductor device 300 with power-gate transistors and cascode-gate transistors, in accordance with some embodiments of the present disclosure. The semiconductor device 300 of FIG. 3 is similar to or correspond to the semiconductor device 100A of FIG. 1A, except for the differences described as follows.

The semiconductor device 300 corresponds to "2.5TIR" embodiment, and "T" represents transistor and "R" represents resistor. The semiconductor device 300 includes cells 31 and 32. The semiconductor device 300 includes transistors 311, 312, 313, 314, 315, 316, 317, 318, 321 and 322. Each of the transistors 312, 314, 316 and 318 includes a cascode-gate transistor. Each of the transistors 311, 312, 313, 314, 315, 316, 317, 318, 321 and 322 includes an NMOS transistor. The transistors 312, 314, 316 and 318 are stacked with the transistors 311, 313, 315 and 317 respectively. The semiconductor device 100B includes electronic elements R31, R32, R33 and R34. The transistor 312 is electrically connected between the transistor 311 and R31. The transistor 314 is electrically connected between the transistor 313 and R32. The transistor 316 is electrically connected between the transistor 315 and R33. The transistor 318 is electrically connected between the transistor 317 and R34.

The transistors 311 and 313 are electrically connected to word line WL31. The transistors 315 and 317 are electrically connected to word line WL32. At least one of the transistors 311, 313, 315, 317 is a word line selector when it is selected or turned on by its corresponding word line. The transistors 311, 312, 315 and 316 are electrically connected to bit line BL31. The transistors 313, 314, 317 and 318 are electrically connected to bit line BL32. The transistors 311, 312, 313 and 314 are electrically connected to power-gate word line WPG31. The transistors 315, 316, 317 and 318 are electrically connected to power-gate word line WPG32. The transistors 312 and 316 are electrically connected to cascode gate line CG31. The transistors 314 and 318 are electrically connected to cascode gate line CG32.

In some embodiments, the size of the transistor 312 is substantially identical to the size of the transistors 311. The size of the transistor 312 is different from the size of the transistors 311. The size of the transistor 314 is substantially identical to the size of the transistors 313. The size of the transistor 314 is different from the size of the transistors 313. In some embodiments, the size of the transistor represents or indicates the length of the transistor, which is defined as a distance of the channel between source and drain of the transistor. In some embodiments, the size of the transistor represents or indicates the width of the transistor, which is perpendicular to the length. In some embodiments, the size of the transistor represents or indicates the area of the transistor, which is proportional to the length and the width of the transistor.

When the semiconductor device 300 is engaged in a program operation, a programming voltage is applied for selecting or enabling the cell 31 to be programed, and the transistor 321 is turned on. Now referring to the embodiments of FIG. 1A and FIG. 3, the programming voltage applied to word line WL31 of FIG. 3 is smaller than the programming voltage applied to word line WL11 of FIG. 1A due to the transistor 312 cascoded to the transistor 311. In other words, the cascoded transistor 312 allows a lower programming voltage to be distributed across the semiconductor device 300 by both a voltage divider and a current divider. The programming voltage applied to word line WL31 of FIG. 3 is substantially half of the programming voltage applied to word line WL11 of FIG. 1A. The reliability of the semiconductor device 300 is enhanced accordingly due to small voltage stress.

In some embodiments, referring to Table 2.1, during the program operation of the semiconductor device 300, when the cell 31 is selected, a programming voltage such as 0.8V to 1V is provided to gate of transistor 311 through word line WL31, a programming voltage such as 1.6V to 2V is provided to drain of transistor 312 through bit line BL31, a programming voltage such as 0.8V to 1V is provided to gate of transistor 312 through cascode gate line CG31, the voltage VD on the drain of transistor 312 is approximately zero, the voltage VC on the drain of transistor 311 is approximately zero, and a programming voltage such as 0.8V to 1V is provided to gate of transistor 321 through power-gate word line WPG31.

In some embodiments, during the program operation of the semiconductor device 300, when the cell 32 is bit line half-selected, a programming voltage provided to gate of transistor 315 is approximately zero, a programming voltage such as 1.6V to 2V is provided to drain of transistor 316 through bit line BL31, a programming voltage such as 0.8V to 1V is provided to gate of transistor 316 through cascode gate line CG31, the voltage VD on the drain of transistor 316 is 1.6V to 2V, the voltage VC on the drain of transistor 315 is 0.8V to 1V, and a programming voltage provided to gate of transistor 322 through power-gate word line WPG32 is approximately zero.

In some embodiments, during the program operation of the semiconductor device 300, when the cell 33 is word line half-selected, a programming voltage such as 0.8V to 1V is provided to gate of transistor 313 through word line WL31, a programming voltage provided to drain of transistor 314 is approximately zero, a programming voltage provided to gate of transistor 314 is approximately zero, the voltage VD on the drain of transistor 314 is approximately zero, the voltage VC on the drain of transistor 313 is approximately zero, and a programming voltage such as 0.8V to 1V is provided to gate of transistor 321 through power-gate word line WPG31.

TABLE 2.1

| | Program Operation | | |
| --- | --- | --- | --- |
| | Selected | WL Half-Selected | BL Half-Selected |
| Word Line (WL) | 0.8 V~1 V | 0.8 V~1 V | 0 |
| Bit Line (BL) | 1.6 V~2 V | 0 | 1.6 V~2 V |
| cascode gate line (CG) | 0.8 V~1 V | 0 | 0.8 V~1 V |
| Voltage VD | 0 | 0 | 1.6 V~2 V |
| Voltage VC | 0 | 0 | 0.8 V~1 V |
| Power-Gate Word Line (WPG) | 0.8 V~1 V | 0.8 V~1 V | 0 |

TABLE 2.2

| | Read Operation | | | |
| --- | --- | --- | --- | --- |
| | Selected | WL Half-Selected | BL Half-Selected | Standby Unselected |
| Word Line (WL) | 0.6 V~0.9 V | 0.6 V~0.9 V | 0 | 0 |
| Bit Line (BL) | 0.6 V~0.9 V | 0 | 0.6 V~0.9 V | 0 |
| cascode gate line (CG) | 0.6 V~0.9 V | 0.6 V~0.9 V | 0.6 V~0.9 V | 0.6 V~0.9 V |
| Voltage VD | 0 | 0 | 0.6 V~0.9 V | 0 |
| Voltage VC | 0 | 0 | 0.6 V~0.9 V | 0 |
| Power-Gate Word Line (WPG) | 0 | 0 | 0 | 0 |

In some embodiments, the programming voltage applied to power-gate word line WPG31 is substantially identical to the programming voltage applied to word line WL31. The programming voltage applied to cascode gate line CG31 is substantially the same as the programming voltage applied to word line WL31. The programming voltage applied to bit line BL31 is different from the programming voltages applied to word line WL31, cascode gate line CG31 and power-gate word line WPG31. The programming voltage applied to bit line BL31 is greater than the programming voltages applied to word line WL31, cascode gate line CG31 and power-gate word line WPG31. The programming voltage applied to bit line BL31 is substantially twice that of the programming voltages applied to word line WL31, cascode gate line CG31 and power-gate word line WPG31. The programming voltage applied to word line WL31, cascode gate line CG31 or power-gate word line WPG31 is half of the programming voltage applied to bit line BL31.

When the semiconductor device 300 is engaged in a read operation, a reading voltage is applied for selecting or enabling the cell 31 to be read, and the transistor 321 is turned off. The reading voltages applied to the word line WL31, bit line BL31 and cascode gate line CG31 is substantially the same. Now referring to the embodiments of FIG. 1A and FIG. 3, the reading voltage applied to word line WL31 of FIG. 3 is substantially identical to the reading voltage applied to word line WL11 of FIG. 1A. The reading voltage applied to bit line BL31 of FIG. 3 is substantially identical to the reading voltage applied to bit line BL11 of FIG. 1A.

In some embodiments, referring to Table 2.2, during the read operation of the semiconductor device 300, when the cell 31 is selected, a reading voltage such as 0.6V to 0.9V is provided to gate of transistor 311 through word line WL31, a reading voltage such as 0.6V to 0.9V is provided to drain of transistor 312 through bit line BL31, a reading voltage such as 0.6V to 0.9V is provided to gate of transistor 312 through cascode gate line CG31, the voltage VD on the drain of transistor 312 is approximately zero, the voltage VC on the drain of transistor 311 is approximately zero, and a reading voltage provided to gate of transistor 321 is approximately zero to turn off the transistor 321 during the read operation.

In some embodiments, during the read operation of the semiconductor device 300, when the cell 32 is bit line half-selected, a reading voltage provided to gate of transistor 315 is approximately zero, a reading voltage such as 0.6V to 0.9V is provided to drain of transistor 316 through bit line BL31, a reading voltage such as 0.6V to 0.9V is provided to gate of transistor 316 through cascode gate line CG31, the voltage VD on the drain of transistor 316 is 0.6V to 0.9V, the voltage VC on the drain of transistor 315 is 0.6V to 0.9V, and a reading voltage provided to gate of transistor 322 through power-gate word line WPG32 is approximately zero to turn off the transistor 322 during the read operation.

In some embodiments, during the read operation of the semiconductor device 300, when the cell 33 is word line half-selected, a reading voltage such as 0.6V to 0.9V is provided to gate of transistor 313 through word line WL31, a reading voltage provided to drain of transistor 314 is approximately zero, a reading voltage such as 0.6V to 0.9V is provided to gate of transistor 314 through cascode gate line CG32, the voltage VD on the drain of transistor 314 is approximately zero, the voltage VC on the drain of transistor 313 is approximately zero, and a programming voltage provided to gate of transistor 321 through power-gate word line WPG31 is approximately zero to turn off the transistor 321 during the read operation.

Figure 4:
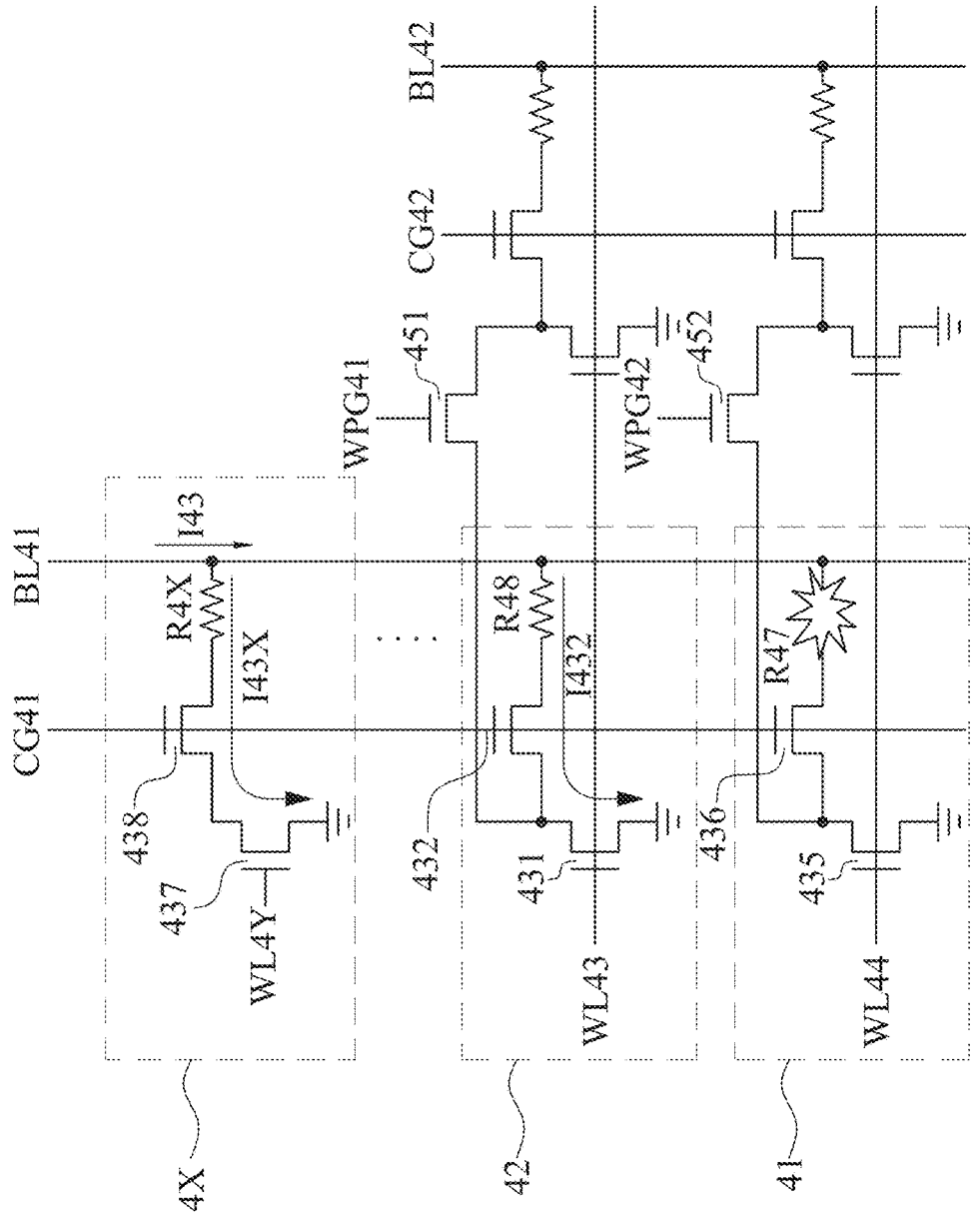
FIG. 4 is a schematic view illustrating operations of a semiconductor device with power-gate transistors and cascode-gate transistors, in accordance with some embodiments of the present disclosure.

FIG. 4 is a schematic view illustrating operations of a semiconductor device 400 with power-gate transistors and cascode-gate transistors, in accordance with some embodiments of the present disclosure.

The semiconductor device 400 includes X cells, such as the cells 41 to 4X, to be controlled by word lines WL41 to WL4X, bit lines BL41 and BL42, cascode gate lines CG41 and CG42, and power-gate word lines WPG41 and WPG42. The leakage current I432 passes through the electronic element R48 and the transistors 431 and 436. The leakage current I41X passes through the electronic element R4X and the transistors 437 and 438. No leakage current passes through the transistors 435 and 436 because of the burned electronic element R47. The leakage current I43 on bit line BL43 includes the leakage currents I432 to I41X. The leakage current I43 is proportional to the number X of the cells. The leakage current I43 is proportional to the number M of the set of the transistors for each cell as illustrated in the previous embodiments.

In some embodiments, by providing the transistors 451 and 452 associated with power-gate word lines WPG41 and WPG42, the leakage current I43 of FIG. 4 is decreased and smaller than leakage current of other approaches that do not include at least transistors 451 and 452. Therefore, the read one failure due to large leakage current is avoided or overcome. The accuracy and reliability of reading data by the semiconductor device 400 is improved.

Figure 5A:
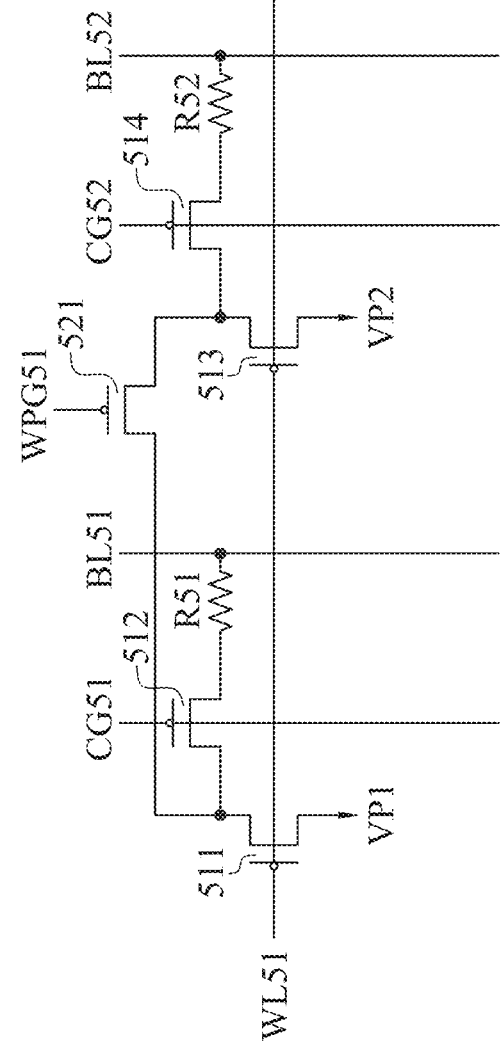
FIG. 5A is a schematic view of a semiconductor device with power-gate transistors and cascode-gate transistors, in accordance with some embodiments of the present disclosure.

FIG. 5A is a schematic view of a semiconductor device 500A with power-gate transistors and cascode-gate transistors, in accordance with some embodiments of the present disclosure. The semiconductor device 500A is similar to or correspond to the semiconductor device 300 of FIG. 3, except for the differences described as follows.

The semiconductor device 500A includes transistors 511, 512, 513, 514 and 521. Each of the transistors 511, 512, 513, 514 and 521 includes a P-type metal-oxide-semiconductor (PMOS) transistor. Each of the transistors 511, 512, 513, 514 and 521 can further represent or include a set of M transistors. Each of the transistors 512 and 514 includes a cascode-gate transistor. The transistors 512 and 514 are stacked with the transistors 511 and 513 respectively. The semiconductor device 500A includes electronic elements R51 and R52. The electronic elements R51 and R52 includes a resistor or a capacitor. The transistor 512 is electrically connected between the transistor 511 and R51. The transistor 514 is electrically connected between the transistor 513 and R52. The transistor 511 is electrically connected to the voltage source VP1. The transistor 513 is electrically connected to the voltage source VP2. The voltage source VP1 is the same as the voltage source VP2. The voltage source VP1 is different from the voltage source VP2. The voltage source VP1 includes a supply voltage VDD or a reference supply voltage VSS. The voltage source VP2 includes a supply voltage VDD or a reference supply voltage VSS.

The gates of the transistors 511 and 513 are electrically connected to word line WL51. The transistors 511 and 512 are electrically connected to bit line BL51. The transistors 513 and 514 are electrically connected to bit line BL52. The gate of the transistor 521 is electrically connected to power-gate word line WPG51. The gate of the transistor 512 is electrically connected to cascode gate line CG51. The gate of the transistor 514 is electrically connected to cascode gate line CG52.

In some embodiment, the transistor 521 is electrically connected between the transistors 511 and 513. The transistor 521 is electrically connected to drains of the transistors 511 and 513. The transistor 521 is electrically connected between the transistors 512 and 514. The transistor 521 is electrically connected to drains of the transistors 512 and 514. In some embodiment, the transistor 521 is turned off during the read operation of the semiconductor device 500A.

The transistor 521 is turned on during the program operation of the semiconductor device 500A. The transistor 521 is shared by the transistors 511 and 513 during the program operation. The transistor 513 is electrically connected to the transistor 511 through the transistor 521 for processing data simultaneously. By arranging the transistor 521, the set of M transistors included in the transistors 511 and 512 is decreased to 0.5M transistors without affecting or sacrificing the program operation. Therefore, the area of the semiconductor device 500A is reduced and the leakage current of the semiconductor device 500A is decreased accordingly. The area ratio and the program performance of the semiconductor device 500A is improved.

Figure 5B:
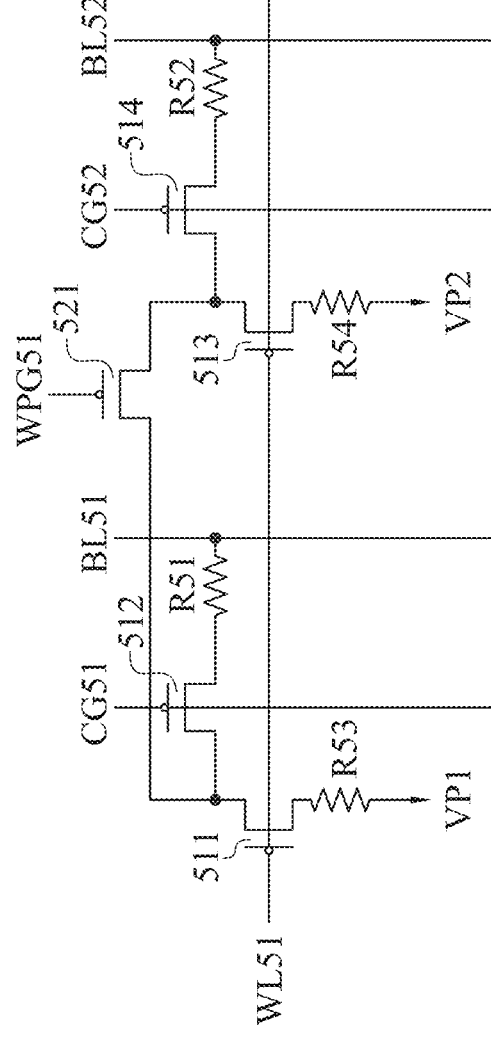
FIG. 5B is a schematic view of another semiconductor device with power-gate transistors and cascode-gate transistors, in accordance with some embodiments of the present disclosure.

FIG. 5B is a schematic view of another semiconductor device 500B with power-gate transistors and cascode-gate transistors, in accordance with some embodiments of the present disclosure. The semiconductor device 500B is similar to or correspond to the semiconductor device 500A of FIG. 5A, except for the differences described as follows.

The semiconductor device 500B includes transistors 511, 512, 513, 514 and 521. The semiconductor device 500B includes electronic elements R51, R52, R53 and R54. The transistors 511 and 513 are electrically connected to word line WL51. The transistors 512 and 514 are electrically connected to bit lines BL51 and BL52 respectively. The transistor 521 is electrically connected to power-gate word line WPG51. The electronic elements R55 and R56 are electrically connected to the voltage sources VP1 and VP2 respectively. Each of the electronic element R51, R52, R53 and R54 includes a resistor or a capacitor. The electronic elements R53 and R54 is identical to the electronic elements R51 and R52. The electronic elements R53 and R54 are different from the electronic elements R51 and R52. In some embodiments, the resistors R53 and R54 can be used to protect the transistors 511 and 513 from being damaged from high bias voltages.

Figure 6A:
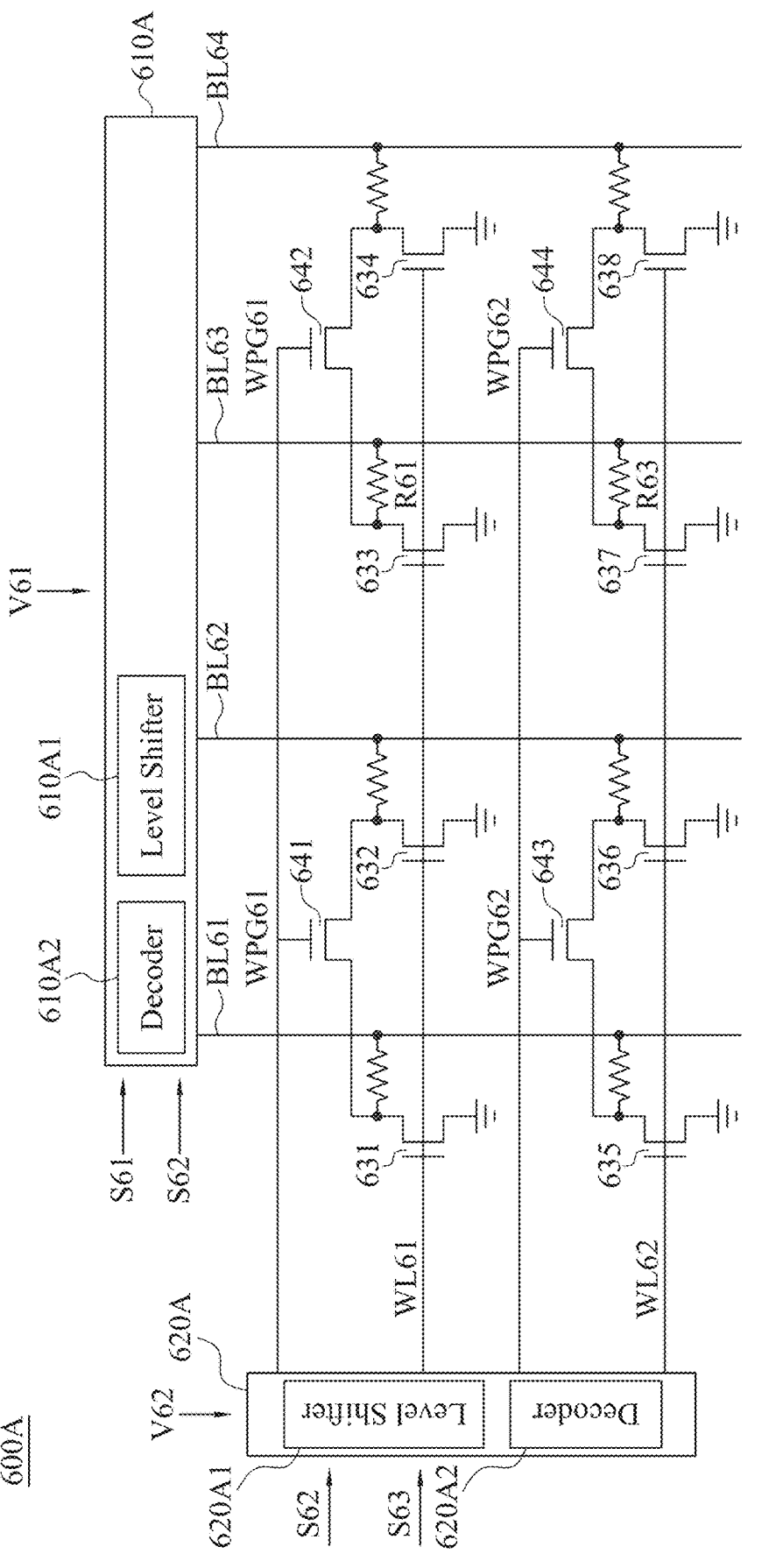
FIG. 6A is a schematic view of a semiconductor device with power-gate transistors and cascode-gate transistors, in accordance with some embodiments of the present disclosure.

FIG. 6A is a schematic view of a semiconductor device 600A with power-gate transistors and cascode-gate transistors, in accordance with some embodiments of the present disclosure. Two controllers 610A and 620A are included in the semiconductor device 600A. In some embodiments, each controller 610A and 620A is configured to operate and control the transistors 631, 632, 633, 634, 635, 636, 637, 638, 641, 642, 643 and 644 through word lines WL61 and WL62, bit lines BL61, BL62, BL63 and BL64, and power-gate word lines WPG61 and WPG62.

The controller 610A is used to select at least one of bit lines BL61, BL62, BL63 and BL64 for programming data or reading data. The controller 620A is used to select at least one of word lines WL61 and WL62 for programming data or reading data. The controller 620A is used to select at least one of power-gate word lines WPG61 and WPG62 for programming data or reading data. In some embodiments, the controller 620A includes a decoder 620A2 and a level shifter 620A1. In some embodiments, controller 610A includes a decoder 610A2 and a level shifter 610A1. The controllers 610A is electrically connected to voltage source V61 for receiving the supply voltage, the programming voltage and the read voltage. The controllers 610A is configured to receive the signal S61 useable for selecting one of the word lines WL61 and WL62. The controllers 610A is configured to receive the signal S62 useable to indicate that the semiconductor device 600A or 600B is in a program mode by a first value of a program enable signal during the program operation or a read mode by a second value of the program enable signal during the read operation. In some embodiments, the first value is different from the second value. The controllers 620A is electrically connected to voltage source V62 for receiving the supply voltage, the programming voltage and the read voltage. The controller 610A is configured to receive the signal S62 useable to indicate that the semiconductor device 600A or 600B is in the program mode or the read mode. The controllers 620A is configured to receive the signal S63 useable for selecting one of the bit lines BL61 to BL64. In some embodiments, each of the controllers 610A and 620A may include but is not limited to, for example, a central processing unit (CPU), a microprocessor, an application-specific instruction set processor (ASIP), a machine control unit (MCU), a graphics processing unit (GPU), a physics processing unit (PPU), a digital signal processor (DSP), an image processor, a coprocessor, a storage controller, a floating-point unit, a network processor, a multi-core processor, a front-end processor or the like. In some embodiments, the controllers 610A and 620A are included in or correspond to the system 800 of FIG. 8.

Figure 6B:
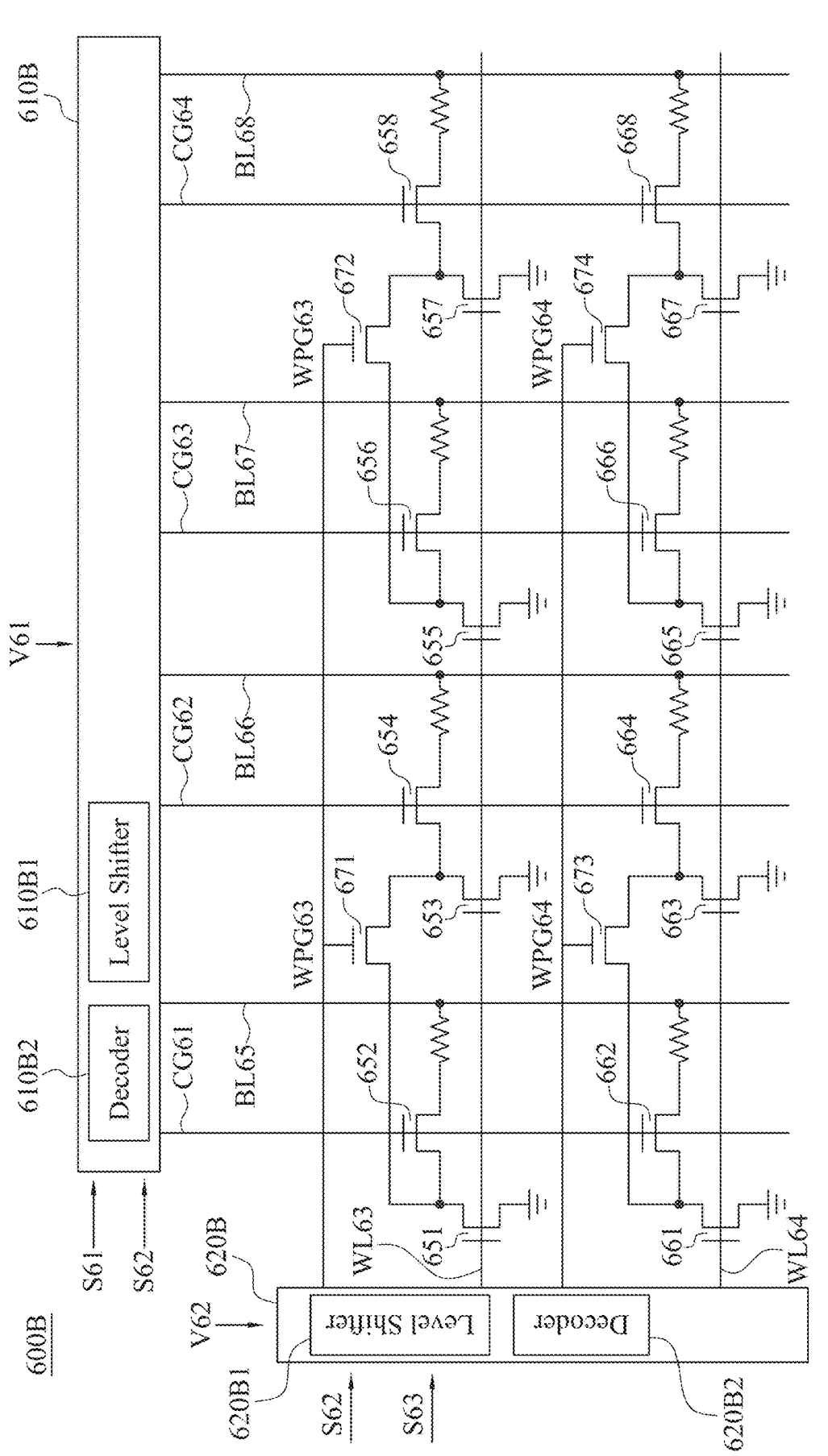
FIG. 6B is a schematic view of another semiconductor device with power-gate transistors and cascode-gate transistors, in accordance with some embodiments of the present disclosure.

FIG. 6B is a schematic view of another semiconductor device 600B with power-gate transistors and cascode-gate transistors, in accordance with some embodiments of the present disclosure. The semiconductor device 600B is similar to or correspond to the semiconductor device 60A of FIG. 6A, except for the differences described as follows. Two controllers 610B and 620B are included in the semiconductor device 600A. In some embodiments, each controller 610B and 620B is configured to operate and control the transistors 651, 652, 653, 654, 655, 656, 657, 658, 661, 662, 663, 664, 665, 666, 667, 668, 671, 672, 673 and 674 through word lines WL63 and WL64, bit lines BL65, BL66, BL67 and BL68, power-gate word lines WPG63 and WPG64, and cascode gate lines CG61, CG62, CG63 and CG64.

The controller 610B is used to select at least one of bit lines BL65, BL66, BL67 and BL68 for programming data or reading data. The controller 620B is used to select at least one of word lines WL63 and WL64 for programming data or reading data. The controller 620B is used to select at least one of power-gate word lines WPG63 and WPG64 for programming data or reading data. In some embodiments, the controller 620B includes a decoder 620B2 and a level shifter 620B1. In some embodiments, controller 610B includes a decoder 610B2 and a level shifter 610B1. The controllers 610B is electrically connected to voltage source V61 for receiving the supply voltage, the programming voltage and the read voltage. The controllers 610B is configured to receive the signal S61 useable for selecting one of the word lines WL63 and WL64. The controller 610B is configured to receive the signal S62 useable to indicate that the semiconductor device 600B is in a program mode by a first value of a program enable signal during the program operation or a read mode by a second value of the program enable signal during the read operation. In some embodiments, the first value is different from the second value. The controllers 620B is electrically connected to voltage source V62 for receiving the supply voltage, the programming voltage and the read voltage. The controller 610B is configured to receive the signal S62 useable to indicate that the semiconductor device 600B is the program mode or the read mode. The controllers 620B is configured to receive the signal S63 useable for selecting one of the bit lines BL65 to BL68.

FIG. 7 illustrates a flow chart including operations for manufacturing a semiconductor device, in accordance with some embodiments of the present disclosure. In operation 702, a first transistor is formed. The first transistor can be formed, for example, on a substrate of a semiconductor wafer. In some embodiments, forming a transistor includes forming one or more logical or functional circuits. In some embodiments, forming a transistor includes forming one or more active areas, source/drain (S/D) structures, isolation structures, gate structures, or the like. In some embodiments, forming a transistor includes performing one or more implantation processes in areas of a semiconductor substrate corresponding to active areas, whereby predetermined doping concentrations and types are achieved for one or more given dopants. In some embodiments, forming a transistor includes performing one or more lithography, deposition, etching, planarizing, or other suitable processes.

In operation 704, a second transistor is formed to electrically connect with the first transistor in parallel so that gates of the first transistor and the second transistor are electrically connected to a word line. In some embodiments, constructing the electrical connection includes constructing one or more conductive segments at one or more of the first, second, or another elevations and/or constructing one or more vias between various elevations. In some embodiments, constructing the electrical connection includes constructing one or more electrical connections between one or more reference voltage paths configured to carry one or both of voltages VDD or VSS as discussed above.

In operation 706, a first electronic element is formed to electrically connect between a drain of the first transistor and a first bit line. In operation 708, a second electronic element is formed to electrically connect between drain of the second transistor and a second bit line.

In operation 710, a third transistor is formed so that drain and source of the third transistor are electrically connected to the drains of the first transistor and the second transistor. In operation 711, the second transistor is electrically coupled to the first transistor through the third transistor. In operation 712, a fourth transistor is formed to electrically connect between the first transistor and the first electronic element so that the fourth transistor is electrically connected to a first cascode gate line. In operation 714, a fifth transistor is formed to electrically connect between the second transistor and the second electronic element so that the fifth transistor is electrically connected to a second cascode gate line. While disclosed method and flow chart are illustrated and described below as a series of acts or events, it will be appreciated that the illustrated ordering of such acts or events are not to be interpreted in a limiting sense. For example, some operations may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 8:
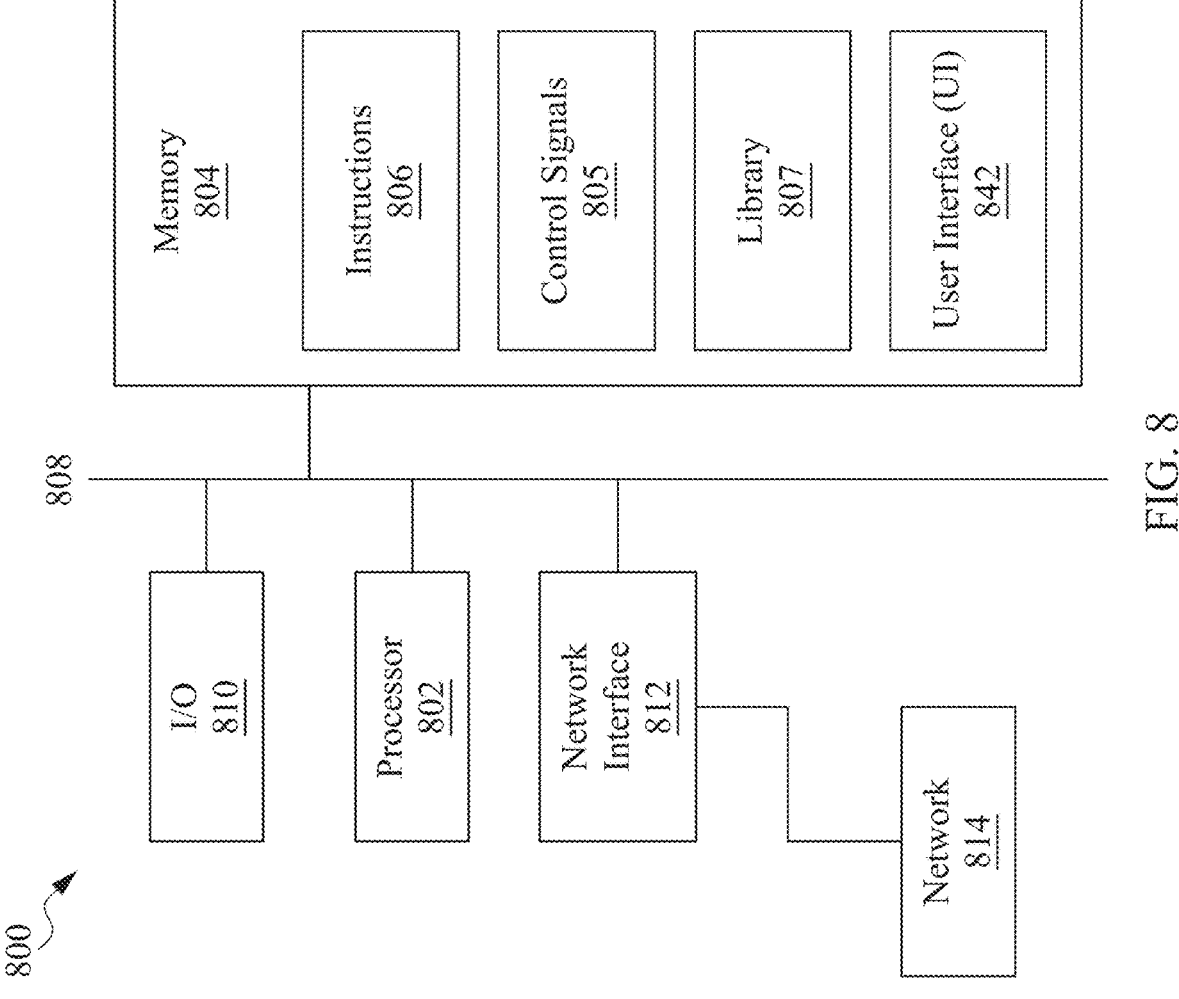
FIG. 8 is a block diagram of a system, in accordance with some embodiments of the present disclosure.

FIG. 8 is a block diagram of a system 800 in accordance with some embodiments. The system 800 is a computing device including a processor 802 and a memory 804. The memory 804 may be a computer-readable storage medium. The storage medium, amongst other things, is encoded with, computer program code or a set of executable instructions 806. Execution of instructions 806 by hardware processor 802 represents (at least in part) an EDA tool which implements a portion or all of a method according to an embodiment, e.g., the methods described herein in accordance with one or more embodiments (hereinafter, the noted processes and/or methods).

The processor 802 may be electrically coupled to the memory 804 (such as computer-readable storage medium) via the bus 808. The processor 802 may be electrically coupled to an I/O interface 810 by bus 808. A network interface 812 may be electrically connected to processor 802 via bus 808. Network interface 812 may be connected to a network 814, so that processor 802 and the memory 804 are capable of connecting to external elements via network 814. Processor 802 may be configured to execute computer program code 806 encoded in memory 804 in order to cause system 800 to be usable for performing a portion or all of the noted processes and/or methods. In one or more embodiments, the processor 802 is a central processing unit (CPU), a multi-processor, a distributed processing system, an application specific integrated circuit (ASIC), and/or a suitable processing unit.

The memory 804 may be an electronic, magnetic, optical, electromagnetic, infrared, and/or semiconductor system (or apparatus or device). The memory 804 may store computer program code (non-transitory instructions) 806 configured to cause system 800 (where such execution represents, at least in part, the EDA tool) to be usable for performing a portion or all of the noted processes and/or methods. In one or more embodiments, the memory 804 may store information which facilitates performing a portion or all of the noted processes and/or methods. In one or more embodiments, the memory 804 may store library 807 of standard cells including such standard cells as disclosed herein, and one or more control signals 805 such as the signals that are disclosed herein.

The system 800 may include I/O interface 810. I/O interface 810 may be coupled to external circuitry. In one or more embodiments, I/O interface 810 may include a keyboard, keypad, mouse, trackball, trackpad, touchscreen, and/or cursor direction keys for communicating information and commands to the processor 802.

The system 800 may include network interface 812 coupled to processor 802. Network interface 812 may allow system 800 to communicate with network 814, to which one or more other computer systems are connected. Network interface 812 may include wireless network interfaces such as BLUETOOTH, WIFI, WIMAX, GPRS, or WCDMA. Network interface 812 may include wired network interfaces such as ETHERNET, USB, or IEEE-1364. In one or more embodiments, a portion or all of noted processes and/or methods, is implemented in two or more systems 80.

The system 800 may be configured to receive information through I/O interface 810. The information received through I/O interface 810 may include one or more of instructions, data, design rules, libraries of standard cells, and/or other parameters for processing by processor 802. The information may be transferred to processor 802 via the bus 808. System 800 may be configured to receive information related to a UI through I/O interface 810. The information may be stored in memory 804 as user interface (UI) 842.

Figure 9:
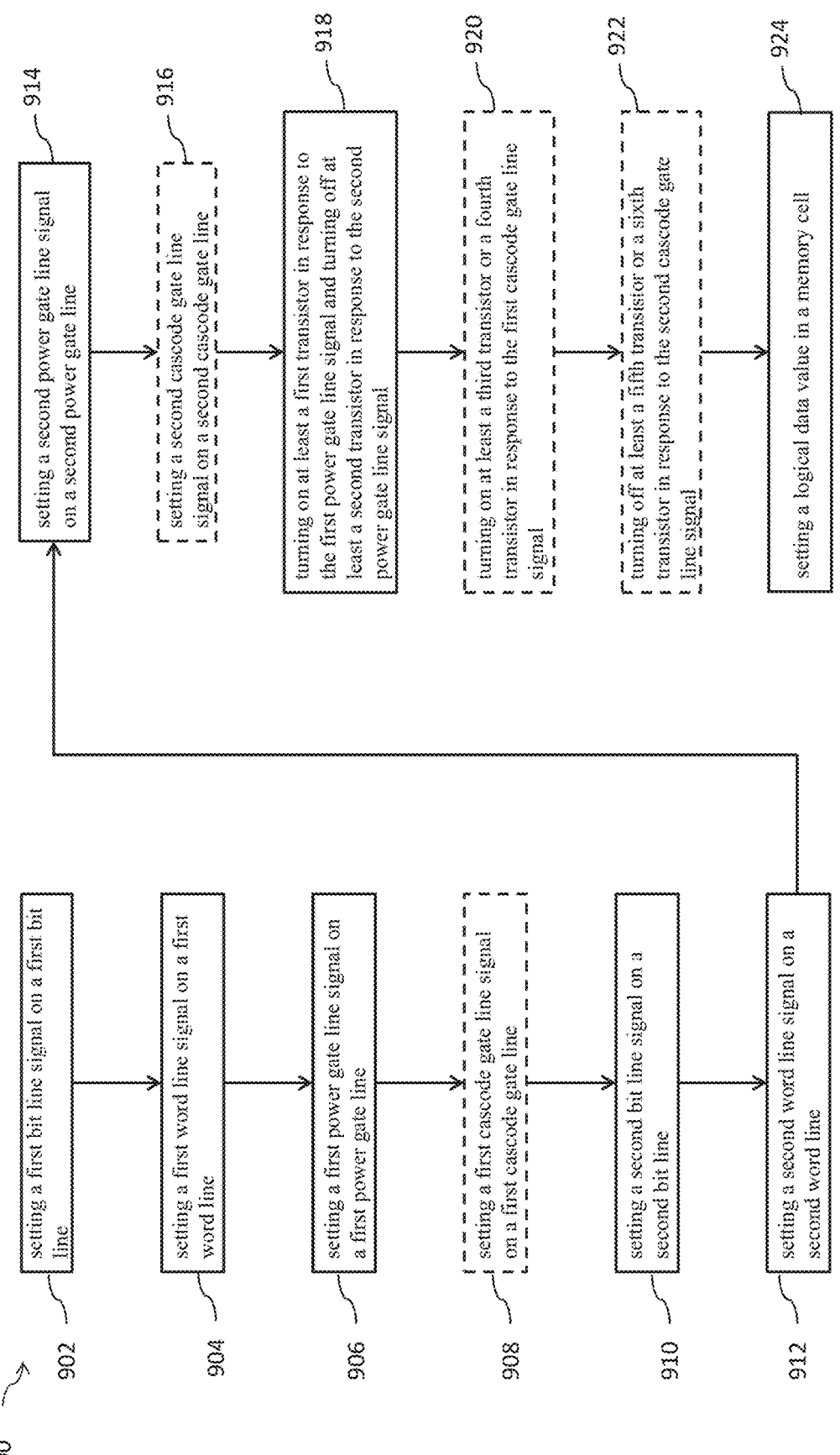
FIG. 9 is a flowchart of a method 900 of operating a circuit, in accordance with some embodiments.

FIG. 9 is a flowchart of a method 900 of operating a circuit, in accordance with some embodiments.

In some embodiments, FIG. 9 is a flowchart of a method 900 of operating at least one of semiconductor device 100A of FIG. 1A, semiconductor device 100B of FIG. 1B, semiconductor device 200A of FIG. 2A, semiconductor device 200B of FIG. 2B, semiconductor device 300 of FIG. 3, semiconductor device 400 of FIG. 4, semiconductor device 500A of FIG. 5A, semiconductor device 500B of FIG. 5B, semiconductor device 600A of FIG. 6A or semiconductor device 600B of FIG. 6B.

In some embodiments, FIG. 9 is a flowchart of a method 900 of programming or writing data to one or more memory cells, and method 900 includes the features of at least one of table 1 or 2.1, and similar detailed description is omitted for brevity.

In some embodiments, FIG. 9 is a flowchart of a method 900 of programming or writing data to one or more memory cells in at least one of semiconductor device 100A of FIG. 1A, semiconductor device 100B of FIG. 1B, semiconductor device 200A of FIG. 2A, semiconductor device 200B of FIG. 2B, semiconductor device 300 of FIG. 3, semiconductor device 400 of FIG. 4, semiconductor device 500A of FIG. 5A, semiconductor device 500B of FIG. 5B, semiconductor device 600A of FIG. 6A or semiconductor device 600B of FIG. 6B, and similar detailed description is omitted for brevity.

It is understood that additional operations may be performed before, during, and/or after the method 900 depicted in FIG. 9, and that some other operations may only be briefly described herein. It is understood that method 900 utilizes features of one or more of least one of semiconductor device 100A of FIG. 1A, semiconductor device 100B of FIG. 1B, semiconductor device 200A of FIG. 2A, semiconductor device 200B of FIG. 2B, semiconductor device 300 of FIG. 3, semiconductor device 400 of FIG. 4, semiconductor device 500A of FIG. 5A, semiconductor device 500B of FIG. 5B, semiconductor device 600A of FIG. 6A or semiconductor device 600B of FIG. 6B, and similar detailed description is omitted for brevity.

In some embodiments, other order of operations of at least one of method 900 or 1000 is within the scope of the present disclosure. At least one of method 900 or 1000 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of at least one of method 900 or 1000 is not performed.

In some embodiments, common elements in at least one of method 900 or 1000 are not labelled in the description of each individual method 900 or 1000 for brevity.

Figure 10:
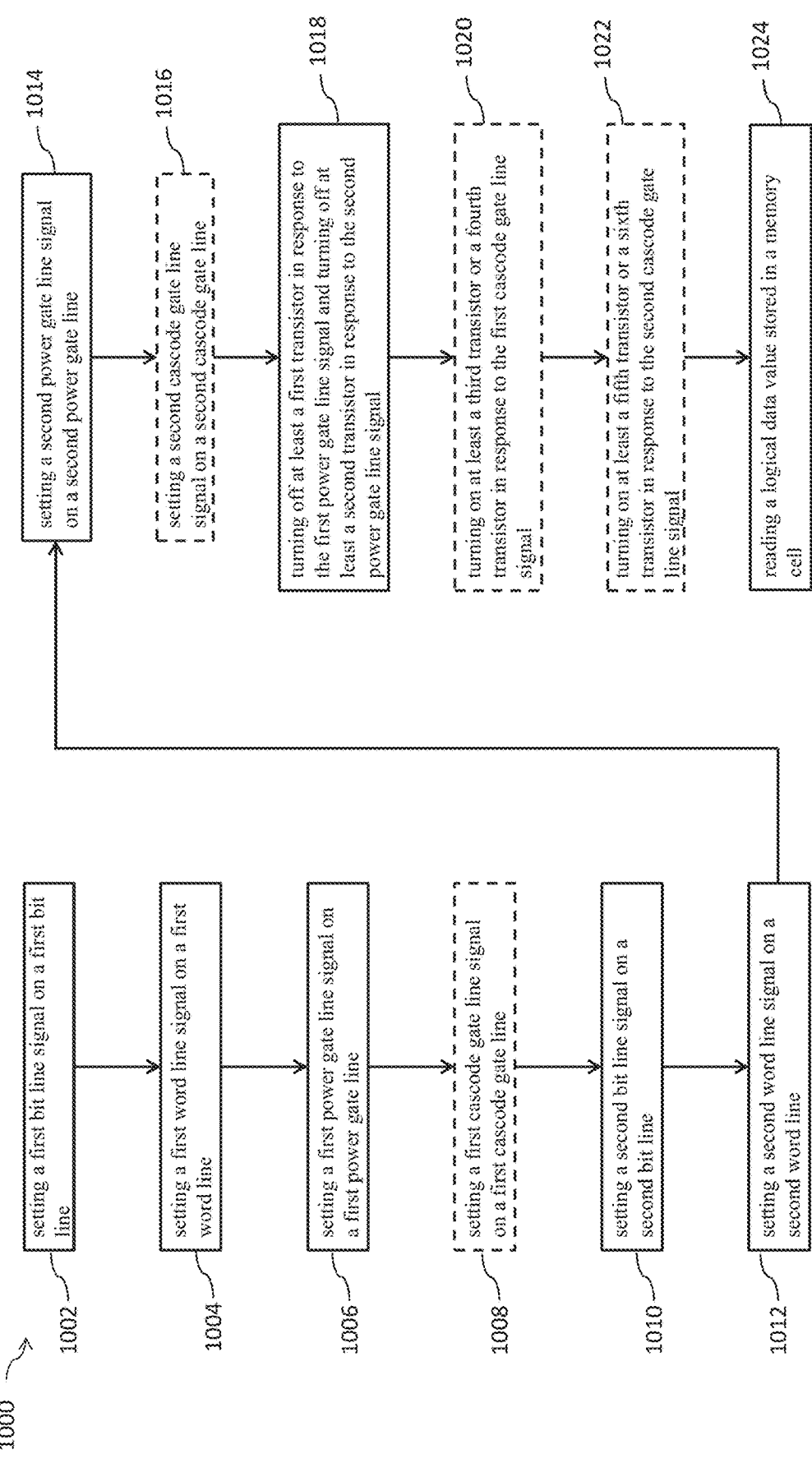
FIG. 10 is a flowchart of a method 1000 of operating a circuit, in accordance with some embodiments.

In some embodiments, one or more additional operations are performed in at least one of method 900 or 1000, but are not described in FIGS. 9-10, but are similar to the description described in FIGS. 1A-6B, and similar detailed description is omitted for brevity.

In operation 902 of method 900, a first bit line signal on a first bit line is set.

In some embodiments, the first bit line signal on a first bit line is set to a first bit line value.

In some embodiments, operation 902 is performed by controller 610A or 610B.

In some embodiments, the first bit line includes one or more of bit lines BL11, BL12, BL21, BL22, BL23, BL24, BL25, BL26, BL27, BL31, BL32, BL41, BL42, BL51, BL52, BL61, BL62, BL63, BL64, BL65, BL66, BL67 or BL68.

In some embodiments, the first bit line value is equal to a voltage according to table 1 or 2.1.

In some embodiments, the memory cell includes at least one of the cells in at least one of semiconductor device 100A of FIG. 1A, semiconductor device 100B of FIG. 1B, semiconductor device 200A of FIG. 2A, semiconductor device 200B of FIG. 2B, semiconductor device 300 of FIG. 3, semiconductor device 400 of FIG. 4, semiconductor device 500A of FIG. 5A, semiconductor device 500B of FIG. 5B, semiconductor device 600A of FIG. 6A or semiconductor device 600B of FIG. 6B.

In operation 904 of method 900, a first word line signal on a first word line is set.

In some embodiments, the first word line signal on a first word line is set to a first word line value.

In some embodiments, operation 904 is performed by controller 620A or 620B.

In some embodiments, the first word line includes one or more of word lines WL11, WL12, WL21, WL22, WL23, WL24, WL31, WL32, WL4Y, WL43, WL44, WL51, WL61, WL62, WL63 or WL64.

In some embodiments, the first word line value is equal to a voltage according to table 1 or 2.1.

In operation 906 of method 900, a first power gate line signal on a first power gate line is set.

In some embodiments, the first power gate line signal on a first power gate line is set to a first power gate line value.

In some embodiments, operation 906 is performed by controller 620A or 620B.

In some embodiments, the first word line includes one or more of power gate lines WL11, WL12, WL21, WL22, WL23, WL24, WL31, WL32, WL4Y, WL43, WL44, WL51, WL61, WL62, WL63 or WL64.

In some embodiments, the first power gate line value is equal to a voltage according to table 1 or 2.1.

In operation 908 of method 900, a first cascode gate line signal on a first cascode gate line is set.

In some embodiments, the first cascode gate line signal on a first cascode gate line is set to a first cascode gate line value.

In some embodiments, operation 908 is performed by controller 610A or 610B.

In some embodiments, the first cascode gate line includes one or more of cascode gate lines CG31, CG32, CG41, CG42, CG51, CG52, CG61, CG62, CG63 or CG64.

In some embodiments, the first cascode gate line value is equal to a voltage according to table 1 or 2.1.

In operation 910 of method 900, a second bit line signal on a second bit line is set.

In some embodiments, the second bit line signal on a second bit line is set to a second bit line value.

In some embodiments, operation 910 is performed by controller 610A or 610B.

In some embodiments, the second bit line includes one or more of bit lines BL11, BL12, BL21, BL22, BL23, BL24, BL25, BL26, BL27, BL31, BL32, BL41, BL42, BL51, BL52, BL61, BL62, BL63, BL64, BL65, BL66, BL67 or BL68.

In some embodiments, the second bit line value is equal to a voltage according to table 1 or 2.1.

In operation 912 of method 900, a second word line signal on a second word line is set.

In some embodiments, the second word line signal on a second word line is set to a second word line value.

In some embodiments, operation 912 is performed by controller 620A or 620B.

In some embodiments, the second word line includes one or more of word lines WL11, WL12, WL21, WL22, WL23, WL24, WL31, WL32, WL4Y, WL43, WL44, WL51, WL61, WL62, WL63 or WL64.

In some embodiments, the second word line value is equal to a voltage according to table 1 or 2.1.

In operation 914 of method 900, a second power gate line signal on a second power gate line is set.

In some embodiments, the second power gate line signal on a second power gate line is set to a second power gate line value.

In some embodiments, operation 914 is performed by controller 620A or 620B.

In some embodiments, the second word line includes one or more of power gate lines WL11, WL12, WL21, WL22, WL23, WL24, WL31, WL32, WL4Y, WL43, WL44, WL51, WL61, WL62, WL63 or WL64.

In some embodiments, the second power gate line value is equal to a voltage according to table 1 or 2.1.

In operation 916 of method 900, a second cascode gate line signal on a second cascode gate line is set.

In some embodiments, the second cascode gate line signal on a second cascode gate line is set to a second cascode gate line value.

In some embodiments, operation 916 is performed by controller 610A or 610B.

In some embodiments, the second cascode gate line includes one or more of cascode gate lines CG31, CG32, CG41, CG42, CG51, CG52, CG61, CG62, CG63 or CG64.

In some embodiments, the second cascode gate line value is equal to a voltage according to table 1 or 2.1.

In operation 918 of method 900, at least a first transistor is turned on in response to the first power gate line signal, and at least a second transistor is turned off in response to the second power gate line signal.

In some embodiments, the at least the first transistor of operation 918 includes at least one of transistor 121, 122, 221, 222, 223, 224, 241, 242, 243, 244, 245, 246, 321, 322, 451, 452, 521, 641, 642, 643, 644, 671, 672, 673 or 674.

In some embodiments, the at least the second transistor of operation 918 includes at least another one of transistor 121, 122, 221, 222, 223, 224, 241, 242, 243, 244, 245, 246, 321, 322, 451, 452, 521, 641, 642, 643, 644, 671, 672, 673 or 674.

In a non-limiting example, the first transistor in FIG. 1A is transistor 121, by turning on transistor 121, transistor 111 is coupled to transistor 112 by transistor 121, in accordance with some embodiments.

In a non-limiting example, the second transistor in FIG. 1A is transistor 122, by turning off transistor 122, transistor 113 is decoupled from transistor 114, in accordance with some embodiments.

In operation 920 of method 900, at least a third transistor or a fourth transistor is turned on in response to the first cascode gate line signal.

In some embodiments, the at least the third transistor of operation 920 includes at least one of transistor 312, 314, 316, 318, 432, 436, 438, 512, 514, 652, 654, 656, 658, 662, 664, 666 or 668.

In some embodiments, the at least the fourth transistor of operation 920 includes at least another one of transistor 312, 314, 316, 318, 432, 436, 438, 512, 514, 652, 654, 656, 658, 662, 664, 666 or 668.

In a non-limiting example, the third transistor in FIG. 3 is transistor 312, by turning on transistor 312, node VC is coupled to node VD by transistor 312, in accordance with some embodiments.

In a non-limiting example, the fourth transistor in FIG. 3 is transistor 316, by turning on transistor 316, node VC (not labelled) in cell 32 is coupled to node VD (not labelled) in cell 32 by transistor 316, in accordance with some embodiments.

In operation 922 of method 900, at least a fifth transistor or a sixth transistor is turned off in response to the second cascode gate line signal.

In some embodiments, the at least the fifth transistor of operation 922 includes at least another one of transistor 312, 314, 316, 318, 432, 436, 438, 512, 514, 652, 654, 656, 658, 662, 664, 666 or 668.

In some embodiments, the at least the sixth transistor of operation 922 includes at least another one of transistor 312, 314, 316, 318, 432, 436, 438, 512, 514, 652, 654, 656, 658, 662, 664, 666 or 668.

In a non-limiting example, the fifth transistor in FIG. 3 is transistor 314, by turning off transistor 314, node VC (not labelled) in cell 33 is decoupled from node VD (not labelled) in cell 33 by transistor 314, in accordance with some embodiments.

In a non-limiting example, the sixth transistor in FIG. 3 is transistor 318, by turning off transistor 318, node VC (not labelled) is decoupled from node VD (not labelled) by transistor 318, in accordance with some embodiments.

In operation 924 of method 900, a logical data value of the memory cell is set.

In some embodiments, the logical value of the memory cell is set as a logic 0 or logic 1. In some embodiments, other values are stored in the memory cell.

In some embodiments, while portions of method 900 is described with respect to semiconductor device 100A of FIG. 1A or semiconductor device 300 of FIG. 3, method 900 is also applicable to at least one of each of semiconductor device 100B of FIG. 1B, semiconductor device 200A of FIG. 2A, semiconductor device 200B of FIG. 2B, semiconductor device 400 of FIG. 4, semiconductor device 500A of FIG. 5A, semiconductor device 500B of FIG. 5B, semiconductor device 600A of FIG. 6A or semiconductor device 600B of FIG. 6B in a similar manner and is not described for brevity.

In some embodiments, one or more of operations 908, 916, 920 or 922 are not performed if a cascode gate line is not included in the semiconductor device.

FIG. 10 is a flowchart of a method 1000 of operating a circuit, in accordance with some embodiments.

In some embodiments, FIG. 10 is a flowchart of a method 1000 of operating at least one of semiconductor device 100A of FIG. 1A, semiconductor device 100B of FIG. 1B, semiconductor device 200A of FIG. 2A, semiconductor device 200B of FIG. 2B, semiconductor device 300 of FIG. 3, semiconductor device 400 of FIG. 4, semiconductor device 500A of FIG. 5A, semiconductor device 500B of FIG. 5B, semiconductor device 600A of FIG. 6A or semiconductor device 600B of FIG. 6B.

In some embodiments, FIG. 10 is a flowchart of a method 1000 of reading data from one or more memory cells, and method 1000 includes the features of at least one of table 1 or 2.2, and similar detailed description is omitted for brevity.

In some embodiments, FIG. 10 is a flowchart of a method 1000 of reading data from one or more memory cells in at least one of semiconductor device 100A of FIG. 1A, semiconductor device 100B of FIG. 1B, semiconductor device 200A of FIG. 2A, semiconductor device 200B of FIG. 2B, semiconductor device 300 of FIG. 3, semiconductor device 400 of FIG. 4, semiconductor device 500A of FIG. 5A, semiconductor device 500B of FIG. 5B, semiconductor device 600A of FIG. 6A or semiconductor device 600B of FIG. 6B, and similar detailed description is omitted for brevity.

It is understood that additional operations may be performed before, during, and/or after the method 1000 depicted in FIG. 10, and that some other operations may only be briefly described herein. It is understood that method 1000 utilizes features of one or more of at least one of semiconductor device 100A of FIG. 1A, semiconductor device 100B of FIG. 1B, semiconductor device 200A of FIG. 2A, semiconductor device 200B of FIG. 2B, semiconductor device 300 of FIG. 3, semiconductor device 400 of FIG. 4, semiconductor device 500A of FIG. 5A, semiconductor device 500B of FIG. 5B, semiconductor device 600A of FIG. 6A or semiconductor device 600B of FIG. 6B, and similar detailed description is omitted for brevity.

In operation 1002 of method 1000, a first bit line signal on a first bit line is set.

In some embodiments, the first bit line signal on a first bit line is set to a first bit line value.

In some embodiments, operation 1002 is performed by controller 610A or 610B.

In some embodiments, the first bit line includes one or more of bit lines BL11, BL12, BL21, BL22, BL23, BL24, BL25, BL26, BL27, BL31, BL32, BL41, BL42, BL51, BL52, BL61, BL62, BL63, BL64, BL65, BL66, BL67 or BL68.

In some embodiments, the first bit line value is equal to a voltage according to table 1 or 2.2.

In some embodiments, the memory cell includes at least one of the cells in at least one of semiconductor device 100A of FIG. 1A, semiconductor device 100B of FIG. 1B, semiconductor device 200A of FIG. 2A, semiconductor device 200B of FIG. 2B, semiconductor device 300 of FIG. 3, semiconductor device 400 of FIG. 4, semiconductor device 500A of FIG. 5A, semiconductor device 500B of FIG. 5B, semiconductor device 600A of FIG. 6A or semiconductor device 600B of FIG. 6B.

In operation 1004 of method 1000, a first word line signal on a first word line is set.

In some embodiments, the first word line signal on a first word line is set to a first word line value.

In some embodiments, operation 1004 is performed by controller 620A or 620B.

In some embodiments, the first word line includes one or more of word lines WL11, WL12, WL21, WL22, WL23, WL24, WL31, WL32, WL4Y, WL43, WL44, WL51, WL61, WL62, WL63 or WL64.

In some embodiments, the first word line value is equal to a voltage according to table 1 or 2.2.

In operation 1006 of method 1000, a first power gate line signal on a first power gate line is set.

In some embodiments, the first power gate line signal on a first power gate line is set to a first power gate line value.

In some embodiments, operation 1006 is performed by controller 620A or 620B.

In some embodiments, the first word line includes one or more of power gate lines WL11, WL12, WL21, WL22, WL23, WL24, WL31, WL32, WL4Y, WL43, WL44, WL51, WL61, WL62, WL63 or WL64.

In some embodiments, the first power gate line value is equal to a voltage according to table 1 or 2.2.

In operation 1008 of method 1000, a first cascode gate line signal on a first cascode gate line is set.

In some embodiments, the first cascode gate line signal on a first cascode gate line is set to a first cascode gate line value.

In some embodiments, operation 1008 is performed by controller 610A or 610B.

In some embodiments, the first cascode gate line includes one or more of cascode gate lines CG31, CG32, CG41, CG42, CG51, CG52, CG61, CG62, CG63 or CG64.

In some embodiments, the first cascode gate line value is equal to a voltage according to table 1 or 2.2.

In operation 1010 of method 1000, a second bit line signal on a second bit line is set.

In some embodiments, the second bit line signal on a second bit line is set to a second bit line value.

In some embodiments, operation 1010 is performed by controller 610A or 610B.

In some embodiments, the second bit line includes one or more of bit lines BL11, BL12, BL21, BL22, BL23, BL24, BL25, BL26, BL27, BL31, BL32, BL41, BL42, BL51, BL52, BL61, BL62, BL63, BL64, BL65, BL66, BL67 or BL68.

In some embodiments, the second bit line value is equal to a voltage according to table 1 or 2.2.

In operation 1012 of method 1000, a second word line signal on a second word line is set.

In some embodiments, the second word line signal on a second word line is set to a second word line value.

In some embodiments, operation 1012 is performed by controller 620A or 620B.

In some embodiments, the second word line includes one or more of word lines WL11, WL12, WL21, WL22, WL23, WL24, WL31, WL32, WL4Y, WL43, WL44, WL51, WL61, WL62, WL63 or WL64.

In some embodiments, the second word line value is equal to a voltage according to table 1 or 2.2.

In operation 1014 of method 1000, a second power gate line signal on a second power gate line is set.

In some embodiments, the second power gate line signal on a second power gate line is set to a second power gate line value.

In some embodiments, operation 1014 is performed by controller 620A or 620B.

In some embodiments, the second word line includes one or more of power gate lines WL11, WL12, WL21, WL22, WL23, WL24, WL31, WL32, WL4Y, WL43, WL44, WL51, WL61, WL62, WL63 or WL64.

In some embodiments, the second power gate line value is equal to a voltage according to table 1 or 2.2.

In operation 1016 of method 1000, a second cascode gate line signal on a second cascode gate line is set.

In some embodiments, the second cascode gate line signal on a second cascode gate line is set to a second cascode gate line value.

In some embodiments, operation 1016 is performed by controller 610A or 610B.

In some embodiments, the second cascode gate line includes one or more of cascode gate lines CG31, CG32, CG41, CG42, CG51, CG52, CG61, CG62, CG63 or CG64.

In some embodiments, the second cascode gate line value is equal to a voltage according to table 1 or 2.2.

In operation 1018 of method 1000, at least a first transistor is turned off in response to the first power gate line signal, and at least a second transistor is turned off in response to the second power gate line signal.

In some embodiments, the at least the first transistor of operation 1018 includes at least one of transistor 121, 122, 221, 222, 223, 224, 241, 242, 243, 244, 245, 246, 321, 322, 451, 452, 521, 641, 642, 643, 644, 671, 672, 673 or 674.

In some embodiments, the at least the second transistor of operation 1018 includes at least another one of transistor 121, 122, 221, 222, 223, 224, 241, 242, 243, 244, 245, 246, 321, 322, 451, 452, 521, 641, 642, 643, 644, 671, 672, 673 or 674.

In a non-limiting example, the first transistor in FIG. 1A is transistor 121, by turning off transistor 121, transistor 111 is decoupled from transistor 112, in accordance with some embodiments.

In a non-limiting example, the second transistor in FIG. 1A is transistor 122, by turning off transistor 122, transistor 113 is decoupled from transistor 114, in accordance with some embodiments.

In operation 1020 of method 1000, at least a third transistor or a fourth transistor is turned on in response to the first cascode gate line signal.

In some embodiments, the at least the third transistor of operation 1020 includes at least one of transistor 312, 314, 316, 318, 432, 436, 438, 512, 514, 652, 654, 656, 658, 662, 664, 666 or 668.

In some embodiments, the at least the fourth transistor of operation 1020 includes at least another one of transistor 312, 314, 316, 318, 432, 436, 438, 512, 514, 652, 654, 656, 658, 662, 664, 666 or 668.

In a non-limiting example, the third transistor in FIG. 3 is transistor 312, by turning on transistor 312, node VC is coupled to node VD by transistor 312, in accordance with some embodiments.

In a non-limiting example, the fourth transistor in FIG. 3 is transistor 316, by turning on transistor 316, node VC (not labelled) in cell 32 is coupled to node VD (not labelled) in cell 32 by transistor 316, in accordance with some embodiments.

In operation 1022 of method 1000, at least a fifth transistor or a sixth transistor is turned on in response to the second cascode gate line signal.

In some embodiments, the at least the fifth transistor of operation 1022 includes at least another one of transistor 312, 314, 316, 318, 432, 436, 438, 512, 514, 652, 654, 656, 658, 662, 664, 666 or 668.

In some embodiments, the at least the sixth transistor of operation 1022 includes at least another one of transistor 312, 314, 316, 318, 432, 436, 438, 512, 514, 652, 654, 656, 658, 662, 664, 666 or 668.

In a non-limiting example, the fifth transistor in FIG. 3 is transistor 314, by turning on transistor 314, node VC (not labelled) in cell 33 is coupled to node VD (not labelled) in cell 33 by transistor 314, in accordance with some embodiments.

In a non-limiting example, the sixth transistor in FIG. 3 is transistor 318, by turning on transistor 318, node VC (not labelled) is coupled to node VD (not labelled) by transistor 318, in accordance with some embodiments.

In operation 1024 of method 1000, a logical data value stored in the memory cell is read.

In some embodiments, the logical data value stored in the memory cell is set as a logic 0 or logic 1. In some embodiments, other values are stored in the memory cell.

In some embodiments, while portions of method 1000 are described with respect to semiconductor device 100A of FIG. 1A or semiconductor device 300 of FIG. 3, method 1000 is also applicable to at least one of each of semiconductor device 100B of FIG. 1B, semiconductor device 200A of FIG. 2A, semiconductor device 200B of FIG. 2B, semiconductor device 400 of FIG. 4, semiconductor device 500A of FIG. 5A, semiconductor device 500B of FIG. 5B, semiconductor device 600A of FIG. 6A or semiconductor device 600B of FIG. 6B in a similar manner and is not described for brevity.

In some embodiments, one or more of operations 1008, 1016, 1020 or 1022 are not performed if a cascode gate line is not included in the semiconductor device.

Some embodiments of the present disclosure provide a semiconductor device. The semiconductor device includes a first transistor, the second transistor, a first circuit, a second circuit and a third transistor. The second transistor is electrically connected to the first transistor, wherein gates of the first transistor and the second transistor are electrically connected to a word line. The first circuit is electrically connected between a drain of the first transistor and a first bit line. The second circuit is electrically connected between a drain of the second transistor and a second bit line. The third transistor is electrically connected between the drain of the first transistor and the drain of the second transistor.

Some embodiments of the present disclosure provide a semiconductor device. The semiconductor device includes a first transistor, the second transistor, a third transistor, a first circuit, and a second circuit. The second transistor is electrically connected to the first transistor, wherein gates of the first transistor and the second transistor are electrically connected to a word line, and sources of the first transistor and the second transistor are electrically connected to power supplies. The third transistor is electrically connected to the drains of the first transistor and the second transistor. The first circuit is electrically connected between drain of the first transistor and a first bit line. The second circuit is electrically connected between drain of the second transistor and a second bit line.

Some embodiments of the present disclosure provide a method for manufacturing a semiconductor device. The method includes forming a first transistor; forming a second transistor, electrically connected with the first transistor in parallel, wherein gates of the first transistor and the second transistor are electrically connected to a word line; forming a first circuit, electrically connected between drain of the first transistor and a first bit line; forming a second circuit, electrically connected between drain of the second transistor and a second bit line; and forming a third transistor, wherein drain and source of the third transistor are electrically connected to the drains of the first transistor and the second transistor.

Some embodiments include a method of operating a semiconductor device. In some embodiments, the method includes setting a first bit line signal on a first bit line, setting a first word line signal on a first word line, setting a first power gate line signal on a first power gate line, setting a second bit line signal on a second bit line, setting a second word line signal on a second word line, setting a second power gate line signal on a second power gate line, and setting a logical data value in a memory cell thereby performing a programming operation of the memory cell. In some embodiments, setting the first power gate line signal on the first power gate line includes turning on at least a first transistor in response to setting the first power gate line signal. In some embodiments, setting the second power gate line signal on the second power gate line includes turning on at least a second transistor in response to setting the second power gate line signal.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a word line;
a first bit line;
a second bit line;
a first transistor;
a second transistor, wherein gates of the first transistor and the second transistor are electrically connected to the word line;
a first circuit, electrically connected between a drain of the first transistor and the first bit line;
a second circuit, electrically connected between a drain of the second transistor and the second bit line; and
a third transistor electrically connected between the drain of the first transistor and the drain of the second transistor,
wherein a size of the third transistor is different from a size of the first transistor and the second transistor.

2. The semiconductor device of claim 1, wherein the size of the third transistor is smaller than the size of the first transistor and the second transistor.

3. The semiconductor device of claim 1, wherein the third transistor is configured to be turned on during a programming operation of the semiconductor device, and the third transistor is configured to be turned off during a read operation of the semiconductor device.

4. The semiconductor device of claim 1, further comprising:
a fourth transistor, electrically connected between the first transistor and the first circuit, wherein the fourth transistor is electrically connected to a first cascode gate line; and
a fifth transistor, electrically connected between the second transistor and the second circuit, wherein the fifth transistor is electrically connected to a second cascode gate line.

5. The semiconductor device of claim 4, wherein, during a write operation of a memory cell in the semiconductor device, a first voltage applied to the word line, the first cascode gate line or the second cascode gate line is different from a second voltage applied to the first bit line or the second bit line.

6. The semiconductor device of claim 5, wherein, during the write operation of the memory cell in the semiconductor device, the first voltage applied to the word line, the first cascode gate line or the second cascode gate line is substantially half of the second voltage applied to the first bit line or the second bit line.

7. The semiconductor device of claim 4, wherein a size of the fourth transistor is substantially identical to a size of the first transistor, and a size of the fifth transistor is substantially identical to a size of the second transistor.

8. The semiconductor device of claim 4, wherein each of the first transistor, the second transistor, the third transistor, the fourth transistor and the fifth transistor comprises an N-type metal-oxide-semiconductor (NMOS) transistor.

9. The semiconductor device of claim 1, further comprising:
a sixth transistor, electrically connected to the first transistor and the second transistor, wherein a gate of the sixth transistor is electrically connected to the word line;
a third circuit, electrically connected between a drain of the sixth transistor and a third bit line; and
a seventh transistor electrically connected to the drain of the second transistor and the drain of the sixth transistor.

10. The semiconductor device of claim 9, wherein each of the first circuit, the second circuit and the third circuit comprises a resistor.

11. The semiconductor device of claim 9, wherein each of the first circuit, the second circuit and the third circuit comprises a capacitor.

12. A semiconductor device, comprising:
a word line;
a first bit line;
a second bit line;
a first cascode gate line;
a first transistor;
a second transistor, electrically connected to the first transistor, wherein gates of the first transistor and the second transistor are electrically connected to the word line, and sources of the first transistor and the second transistor are electrically connected to power supplies;
a third transistor electrically connected to drains of the first transistor and the second transistor;
a first circuit, electrically connected between a drain of the first transistor and the first bit line;
a second circuit, electrically connected between a drain of the second transistor and the second bit line;
a fourth transistor, electrically connected between the first transistor and the first circuit, wherein the fourth transistor is electrically connected to the first cascode gate line and the first bit line.

13. The semiconductor device of claim 12, wherein the third transistor is configured to be turned on during a program operation of the semiconductor device, and the third transistor is configured to be turned off during a read operation of the semiconductor device.

14. The semiconductor device of claim 12, wherein a size of the third transistor is smaller than a size of the first transistor and the second transistor.

15. The semiconductor device of claim 12, further comprising:
a second cascode gate line; and
a fifth transistor, electrically connected between the second transistor and the second circuit, wherein the fifth transistor is electrically connected to the second cascode gate line and the second bit line.

16. The semiconductor device of claim 15, wherein each of the first transistor, the second transistor, the third transistor, the fourth transistor and the fifth transistor comprises a P-type metal-oxide-semiconductor (PMOS) transistor.

17. The semiconductor device of claim 15, further comprising:
a third circuit, electrically connected between the power supplies and the source of the first transistor; and
a fourth circuit, electrically connected between the power supplies and the source of the second transistor.

18. A method of operating a semiconductor device, comprising:
setting a first bit line signal on a first bit line;
setting a first word line signal on a first word line;
setting a first power gate line signal on a first power gate line, wherein setting the first power gate line signal on the first power gate line comprises:
turning on at least a first transistor in response to setting the first power gate line signal;
setting a second bit line signal on a second bit line;
setting a second word line signal on a second word line;
setting a second power gate line signal on a second power gate line, wherein setting the second power gate line signal on the second power gate line comprises:

turning on at least a second transistor in response to setting the second power gate line signal; and setting a logical data value in a memory cell thereby performing a programming operation of the memory cell.

19. The semiconductor device of claim 2, wherein the size of the third transistor is equal to one half of the size of the first transistor.

20. The semiconductor device of claim 19, wherein the size of the third transistor is equal to one half of the size of the second transistor.

* * * * *